(12) United States Patent
Heimann et al.

(10) Patent No.: US 12,299,509 B2
(45) Date of Patent: May 13, 2025

(54) HIGHLY LINEAR MULTIPLIER

(71) Applicant: ANABRID GMBH, Berlin (DE)

(72) Inventors: Lars Heimann, Berlin (DE); Bernd Ulmann, Bad Schwalbach (DE); Sven Koeppel, Münster (DE)

(73) Assignee: ANABRID GMBH, Berlin (DE)

( * ) Notice: Subject to any disclaimer, the term of this patent is extended or adjusted under 35 U.S.C. 154(b) by 54 days.

(21) Appl. No.: 18/268,384

(22) PCT Filed: Dec. 14, 2021

(86) PCT No.: PCT/EP2021/085622
§ 371 (c)(1),
(2) Date: Jun. 20, 2023

(87) PCT Pub. No.: WO2022/136017
PCT Pub. Date: Jun. 30, 2022

(65) Prior Publication Data
US 2024/0070406 A1    Feb. 29, 2024

(30) Foreign Application Priority Data

Dec. 21, 2020   (EP) .................................. 20215884

(51) Int. Cl.
*G06G 7/16*      (2006.01)
*H03F 3/21*      (2006.01)
*H03F 3/45*      (2006.01)

(52) U.S. Cl.
CPC ............... *G06G 7/16* (2013.01); *H03F 3/211* (2013.01); *H03F 3/45183* (2013.01)

(58) Field of Classification Search
CPC ........ G06G 7/16; H03F 3/211; H03F 3/45183
See application file for complete search history.

(56) References Cited

U.S. PATENT DOCUMENTS

2016/0315588 A1* 10/2016 Ozanoglu .............. H03G 3/007

FOREIGN PATENT DOCUMENTS

CN      115395897 A  * 11/2022
JP      2007133540 A    5/2007

OTHER PUBLICATIONS

International Search Report and Written Opinion dated Jan. 25, 2022 corresponding to International Patent Application No. PCT/EP2021/085622.

(Continued)

*Primary Examiner* — Daniel C Puentes
(74) *Attorney, Agent, or Firm* — SQUIRE PATTON BOGGS (US) LLP

(57) ABSTRACT

There is provided a linearized multiplier configured to produce an output current representing a product of a first input voltage and a second input voltage, comprising: a first transconductance stage which is configured to input the first input voltage and to output a first pair of differential currents, wherein the first transconductance stage comprises a negative feedback network, at least one second transconductance stage which is configured to input the second input voltage and to output a pre-distorted voltage of the second input voltage, wherein each second transconductance stage comprises a negative feedback network, a pair of third transconductance stages, each of which is configured to input a voltage corresponding to the pre-distorted voltage of the second input voltage and to output a second pair of differential currents, when being supplied with a bias current corresponding to a respective current of the first pair of differential currents.

20 Claims, 18 Drawing Sheets

(56) References Cited

OTHER PUBLICATIONS

M. Dei et al., "A Four Quadrant Analog Multiplier Based on a Novel CMOS Linear Current Divider," Research in Microelectronics and Electronics, 2009, PRIME 2009, IEEE, Jul. 12, 2009, pp. 128-131, XP031510388.
S. L. Wong et al., "Regular Correspondence—Wide Dynamic Range Four-Quadrant CMOS Analog Multiplier Using Linearized Transconductance Stages," IEEE Journal of Solid-State Circuits, vol. SC-21, No. 6, Dec. 1986, pp. 1-3, XP055807138.
Gunhee Han et al., "CMOS Transconductance Multipliers: A Tutorial," IEEE Transactions on Circuits and Systems—II: Analog and Digital Signal Processing, vol. 45, No. 12, Dec. 2, 1998, XP011012949.
Zhangcai Huang et al., "A Highly Linear and Wide Input Range Four-Quadrant CMOS Analog Multiplier Using Active Feedback," IEICE Transactions on Electronics, vol. E92-C, No. 6, Jun. 2, 2009, pp. 806-814, XP001547472.
Office Action dated Jul. 22, 2024, in corresponding Japanese Patent Application No. 2023-537574, with English translation thereof.
Decision to Grant a Patent dated Dec. 23, 2024 corresponding to Japanese Patent Application No. 2023-537574, with English translation thereof.

\* cited by examiner

HIGHLY LINEAR MULTIPLIER

FIELD

The present disclosure relates to a highly linear multiplier. More specifically, the present disclosure relates to the design of a multiplier which is capable producing an output current representing a product of input voltages with high accuracy.

BACKGROUND

Multipliers are a versatile elementary function to produce, as an output signal, the product of two analog input signals, e.g. for variable gain amplifiers, mixers and computing circuits. An integrated analog multiplier based on bipolar transistors was first introduced in 1968 by Barrie Gilbert. Since then, analog multipliers based on bipolar transistors, also known as Gilbert cells, have had a successful development history. The precision of bipolar multipliers is based on a pre-distortion of the input signals to compensate for the non-linearity of a bipolar differential stage.

Integrated circuits based on MOS or CMOS technology became widespread from around the 1970s. Their advantage lies especially in the possibility of energy-efficient digital integration and scalability. At the same time, high-performance analog circuits can be integrated on CMOS technology. With the widespread use of CMOS technology for analog circuits, the search for equivalents to Gilbert cells known from bipolar technology also began. As an example, a Gilbert cell can be realized in CMOS if the MOSFET is operated at very low current densities, i.e. at gate voltages below the threshold voltage VTH, such that the MOSFET operates in weak inversion and has an exponential characteristic curve. Such a multiplier based on MOSFETs in weak inversion have at least the disadvantage that they have low bandwidths and are certainly relatively inaccurate and subject to temperature drift due to the variation of the threshold voltage from device to device. Since MOSFETs do not have a base current like bipolar transistors, no circuits equivalent to bipolar multipliers can be used to pre-distort the input signals to compensate for non-linearity.

Therefore, multipliers based on the Gilbert principle have not been widely used in CMOS technology for applications requiring high accuracy. As indicated above, this is because there is no ideal pre-distortion for a CMOS differential stage such that sufficient precision cannot be achieved. For this reason, CMOS multipliers are based either on the parabolic characteristic (proportional to $V_{GS}^2$) if the MOSFET is operating in saturation ($V_{DS} > V_{GS} - V_{TH}$), or on the linear term ($V_{GS} \times V_{DS}$) if the MOSFET is operating in the linear domain, i.e. $V_{DS} < V_{GS} - V_{TH}$.

In the following, the issues of non-linearities in a CMOS differential stage are explained. These issues are relevant as a Gilbert-type multiplier in CMOS technology contains such CMOS differential stages, and the non-linearity in a CMOS differential stage affect the overall linearity and thus the overall accuracy of the multiplier as a whole.

FIG. 1 shows an example of a circuit diagram of a differential stage of CMOS transistors, i.e. a CMOS differential pair.

In FIG. 1, $I_{bias}$ denotes the bias current (i.e. the tail current or the common current), $V_{xDC}$ denotes the mean common-mode voltage, and vx denotes the input differential voltage, which is applied half to the positive input $V_{XinP}$ and half to the negative input $V_{XinN}$. As a load, there is a dummy voltage source between the drain node and the supply voltage Vdd of each transistor, which is used in a switching simulation to measure the current.

Hereinafter, an example is considered in which vx=0 mV is assumed as the operating point and $I_{bias}$=2 µA is assumed as the bias current.

FIGS. 2(a) and 2(b) shows examples of characteristics of the differential stage shown in FIG. 1, wherein FIG. 2(a) shows an example of a voltage-current transfer function and FIG. 2(b) shows an example of a transconductance function.

As is evident from FIG. 2(a), in which the currents of both branches in the differential stage are plotted over the input differential voltage, the differential stage has a small dynamic range and a non-linear transfer function, i.e. a non-linear voltage-to-current conversion. As is evident from FIG. 2(b), the transconductance $G_m$ which is the derivative of the difference of the currents of both branches in the differential stage has a peak around the operating point.

The circuit of a Gilbert cell consists of a bipolar differential stage with fixed bias current, on which a further bipolar differential stage is stacked in each branch, such that non-linearities are caused by the non-linear input-current-to-output-current conversion of the bipolar differential stage that is arranged at the bottom. As the highly non-linear transconductance $G_m$ in 2(b) shows, a CMOS differential stage has a similar problem.

In stacked differential stages, non-linearities can basically be caused by two effects, namely a variation in the input differential voltage when assuming that the common current in the stacked differential stages is constant (as already shown in FIGS. 2(a) and 2(b)), and a variation in the common current when assuming that the input differential voltage is constant. If it were possible to linearize the voltage-current transfer function of the CMOS differential stage, the question remains whether, with a constant input differential voltage, the distribution of the current would be exactly proportional when the common current is varied.

FIGS. 3(a) and 3(b) shows examples of further characteristics of the differential stage shown in FIG. 1, wherein FIG. 3(a) shows an example of a current-current transfer function and FIG. 3(b) shows an example of a function of the derivative of the current difference.

In FIG. 3(a), the currents of both branches in the differential stage are plotted over the bias current as a result of a simulation where the input differential voltage is kept constant with vx=100 mV, where the voltage-current transfer function is already highly nonlinear (as is evident from FIGS. 2(a) and 2(b)). While in FIGS. 2(a) and 2(b) the input differential voltage vx is varied and Ibias=2 µA is kept constant, the common/tail current Ibias is varied in FIG. 3(a). It is to be noted that the operating point with vx=100 mV in FIG. 2(a) is in FIG. 3(a) at Ibias=2 µA, and the drain currents are $I(V_{muIP})$=1.87 µA and $I(V_{muIN})$=0.13 µA. It can be seen from FIG. 3(a) that the currents in the two branches scale very linearly. Analogously to FIG. 2(b), FIG. 3(b) shows the derivative of the difference of the currents of both branches in the differential stage. Assuming a nominal bias current of 2 µA, a current variation by a factor of 8, i.e. between 0.5 µA and 4 µA, changes the derivative by only about ±5.8% (derivative @0.5 µA: −0.88, @2.0 µA: −0.86, @4.0 µA: −0.83).

From the above, it can be recognized that there a CMOS differential stage and thus any differential stage of a CMOS-based Gilbert multiplier suffers from non-linearity, and that this non-linearity is primarily due to the non-linear voltage-current transfer function and less to non-idealities in the proportionality of the output current to the common operating current, i.e. the tail or bias current.

Therefore, there is room for improvement in the linearity of a multiplier, especially a Gilbert-type multiplier in CMOS technology.

SUMMARY

Various embodiments of the present disclosure aim at addressing at least part of the above issues and/or problems and drawbacks.

More specifically, it is an object of the present disclosure to provide a highly linear multiplier, i.e. a multiplier capable of realizing a multiplication with high accuracy, especially a Gilbert-type multiplier in CMOS technology.

Various aspects of embodiments of the present disclosure are set out in the appended claims.

According to an exemplary aspect of the present disclosure, there is provided a multiplier configured to produce an output current representing a product of a first input voltage and a second input voltage, comprising: a first transconductance stage which is configured to input the first input voltage and to output a first pair of differential currents, when being supplied with a first fixed bias current, wherein the first transconductance stage comprises a negative feedback network, at least one second transconductance stage which is configured to input the second input voltage and to output a pre-distorted voltage of the second input voltage, when being supplied with a second fixed bias current, wherein each second transconductance stage comprises a negative feedback network, a pair of third transconductance stages, each of which is configured to input a voltage corresponding to the pre-distorted voltage of the second input voltage and to output a second pair of differential currents, when being supplied with a bias current corresponding to a respective current of the first pair of differential currents, and a combination network which is configured to generate the output current by combining the second pairs of differential currents from both of the pair of third transconductance stages.

With such a configuration, it is possible to provide a linearized multiplier based on transconductances. More specifically, linearized voltage-input units can be realized, which are capable of compensating for the non-linearity of the transconductances, such as e.g. differential stages constituting the transconductances.

In the above configuration, the first transconductance stage may comprise two current outputs for each of the first pair of differential currents, and the first transconductance stage may be configured such that, for each of the first pair of differential currents, one of the two current outputs is subtracted from a first reference current corresponding to an output current at an operating point of the first transconductance stage and the resulting current difference is fed back via a feedback resistor to an input side of the first transconductance stage, and the other one of the two current outputs is output from the first transconductance stage.

With such a configuration, it is possible to linearize the voltage-input unit for inputting the first voltage. More specifically, a negative feedback can be realized in the first transconductance stage, which is capable of compensating for the non-linearity of its transconductance, such as e.g. the differential stage constituting its transconductance.

In any one of the above configurations, each second transconductance stage may be configured such that, for each of a pair of currents at an output side of the second transconductance stage, the current is subtracted from a second reference current corresponding to an output current at an operating point of the second transconductance stage and the resulting current difference is fed back via a feedback resistor on a feedback path to an input side of the second transconductance stage, and each second transconductance stage may be configured to output, as the pre-distorted voltage, a potential difference between the two feedback paths.

With such a configuration, it is possible to linearize the voltage-input unit for inputting the second voltage. More specifically, a negative feedback can be realized in the second transconductance stage so as to generate a pre-distorted voltage of the second input voltage, which is capable of compensating for the non-linearity of the transconductance of the third transconductance stage, such as e.g. the differential stage constituting its transconductance.

In any one of the above configurations, the second fixed bias current of a second transconductance stage may be set to be in the middle of a range of the bias current of a third transconductance stage which is configured to input the voltage based on the pre-distorted voltage from said second transconductance stage. Additionally or alternatively, a transconductance of a second transconductance stage may be at least substantially equal to a transconductance of a third transconductance stage which is configured to input the voltage based on the pre-distorted voltage from said second transconductance stage. Additionally or alternatively, a second transconductance stage and a third transconductance stage which is configured to input the voltage based on the pre-distorted voltage from said second transconductance stage may be matched to each other. Additionally or alternatively, a gain of a second transconductance stage may be set to be such that input of the pre-distorted voltage of the second input voltage causes a third transconductance stage, which is configured to input the voltage based on the pre-distorted voltage from said second transconductance stage, to output the second pair of differential currents being equal to a pair of differential currents which is generated by the transconductance of said second transconductance stage upon input of the second input voltage.

With any one of such configurations, it is possible to design and/or operate the second transconductance stage, for achieving an appropriate linearization of the voltage-input unit for inputting the second voltage In any one of the above configurations, each third transconductance stage may be configured to input the pre-distorted voltage of the second input voltage from a second transconductance stage.

With such a configuration, it is possible to linearize the multiplier in a simple and efficient manner.

In any one of the above configurations, the multiplier may comprise an error compensating circuit which is configured to generate a compensated voltage for compensating an error in the output current with respect to an exact algebraic product of the first input voltage and the second input voltage. Additionally or alternatively, the multiplier may comprise at least one fourth transconductance stage which is configured to input the second input voltage and to output a scaled voltage of the second input voltage, when being supplied with a third fixed bias current, and at least one multiplication-addition network which is configured to generate a compensated voltage of the second input voltage by multiplying the pre-distorted voltage of the second input voltage from a second transconductance stage by a first factor, multiplying the scaled voltage of the second input voltage from a fourth transconductance stage by a second factor and adding the multiplied pre-distorted voltage and the multiplied scaled voltage, wherein each third transconductance stage may be configured to input the compensated voltage of the second input voltage from a multiplication-addition network.

With such a configuration, it is possible realize the multiplier with improved error compensation and, thus, linearization.

In any one of the above configurations, each transconductance stage may comprises a differential pair of CMOS transistors with the bias current as tail current. Additionally or alternatively, the multiplier may be integrated in CMOS technology. Additionally or alternatively, the first transconductance stage may be built with NMOS transistors, and any one of the second and third transconductance stages may be built with PMOS transistors.

With such a configuration, it is possible to implement and integrate the multiplier based on CMOS technology.

In any one of the above configurations, the first and second input voltages may be or represent analog signals, or at least one of the first and second input voltages may be or represent a signal resulting from pulse width modulation of an analog signal, or one of the first and second input voltages may be or represent a signal a reference signal of a digital-to-analog converter and the other one of the first and second input voltages may be or represent a digital input of the digital-to-analog converter. Namely, the multiplier may be an analog multiplier, i.e. a multiplier in an analog configuration, realization or mode (wherein the first and second input voltages are or represent analog signals), or the multiplier may be a (partially or fully) digital analog multiplier, i.e. a multiplier in a (partially or fully) digital configuration, realization or mode (wherein at least one of the first and second input voltages is or represents a signal resulting from pulse width modulation of an analog signal), or the multiplier may be a (partially or fully) digital analog multiplier, i.e. a multiplier in a (partially or fully) digital configuration, realization or mode (wherein one of the first and second input voltages is or represents a signal a reference signal of a digital-to-analog converter, and the other one of the first and second input voltages is or represents a digital input of the digital-to-analog converter).

With any one of such configurations, it is possible to adapt the multiplier to an intended use or an underlying application/use environment or situation, thereby enhancing the applicability of the multiplier.

Further developments and/or modifications of the aforementioned exemplary aspects of the present disclosure are set out in the following.

BRIEF DESCRIPTION OF THE DRAWINGS

In the following, the present disclosure will be described in greater detail by way of non-limiting examples with reference to the accompanying drawings, in which FIGS. 2(a) and 2(b) shows examples of characteristics of the differential stage shown in FIG. 1, wherein FIG. 2(a) shows an example of a voltage-current transfer function and FIG. 2(b) shows an example of a transconductance function, FIGS. 3(a) and 3(b) shows examples of further characteristics of the differential stage shown in FIG. 1, wherein FIG. 3(a) shows an example of a current-current transfer function and FIG. 3(b) shows an example of a function of the derivative of the current difference.

DETAILED DESCRIPTION

Figure 1:
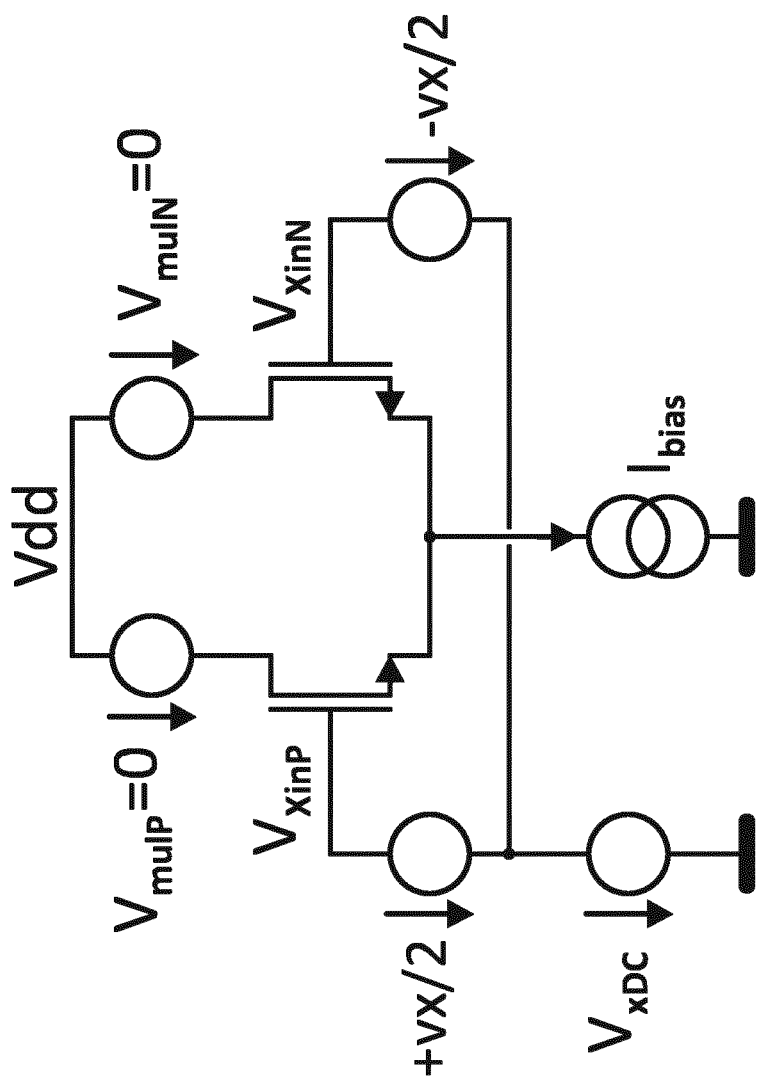
FIG. 1 shows an example of a circuit diagram of a differential stage of CMOS transistors, i.e. a CMOS differential pair.

The present disclosure is described herein with reference to particular non-limiting examples and to what are presently considered to be conceivable (examples of) embodiments. A person skilled in the art will appreciate that the present disclosure is by no means limited to these examples and embodiments, and may be more broadly applied.

It is to be noted that the following description mainly refers to specifications being used as non-limiting examples and embodiments for certain exemplifying circuit structures, implementations and technologies. Such description is only used in the context of the presented non-limiting examples and embodiment, and does naturally not limit the present disclosure in any way. Rather, any other circuit structures, implementations and technologies may equally be utilized as long as complying with what is described herein and/or embodiments described herein are applicable thereto.

Hereinafter, various examples and embodiments of the present disclosure and its aspects are described using several variants and/or alternatives. It is generally to be noted that, according to certain needs and constraints, all of the described variants and/or alternatives may be provided alone or in any conceivable combination (also including combinations of individual features of the various variants and/or alternatives). In this description, the words "comprising" and "including" should be understood as not limiting the described examples and embodiments to consist of only those features that have been mentioned, and such examples and embodiments may also contain structures, units, modules, networks, etc. that have not been specifically mentioned.

In the drawings, it is to be noted that lines/arrows interconnecting individual blocks or entities are generally meant to illustrate an operational coupling there-between, which may be a physical and/or logical coupling, which on the one hand is implementation-independent and on the other hand may also comprise an arbitrary number of intermediary functional blocks or entities not shown.

According to embodiments of the present disclosure, in general terms, there is provided a highly linear multiplier, i.e. a multiplier capable of realizing a multiplication with high accuracy, especially a Gilbert-type multiplier in CMOS technology.

When hereinafter reference is made to a transconductance, this can mean a transconductance as an electrical characteristic relating a current through the output of a device, unit or element to a voltage across the input of the device unit or element (i.e. the reciprocal of resistance) or a transconductance element as a structural means (e.g. a device, unit or element) exhibiting a transconductance property (i.e. a transconductance-related transfer function). Also, a transconductance stage refers to a structural means including a transconductance, namely a transconductance property or element, such that a voltage across its input is converted into a current at its output.

Figure 4:
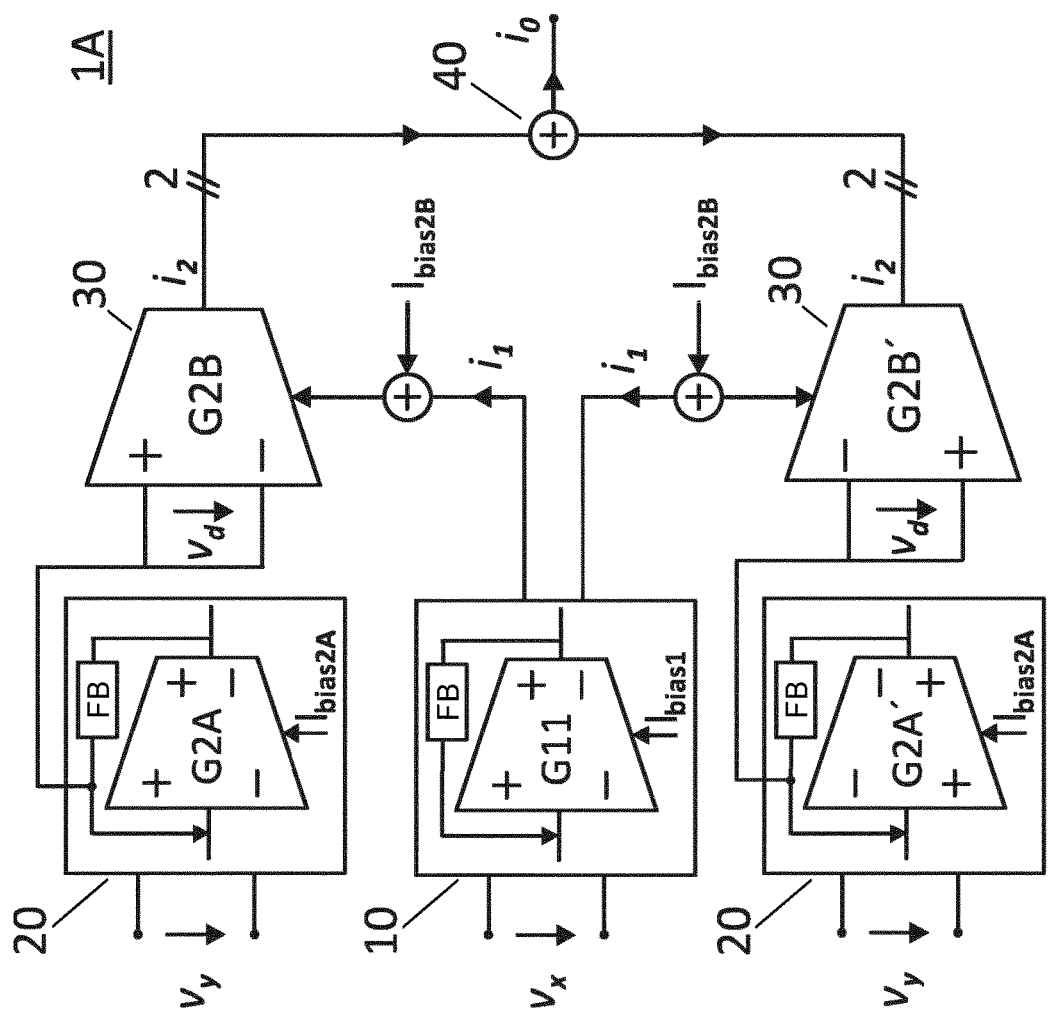
FIG. 4 shows an example of a circuit diagram of a multiplier according to an embodiment.

FIG. 4 shows an example of a circuit diagram of a multiplier according to an embodiment. The multiplier shown in FIG. 4 is an analog multiplier which is based on transconductances or, stated in other terms, an analog multiplier based on the Gilbert principle (i.e. a Gilbert-type multiplier).

As shown in FIG. 4, the multiplier 1A is an analog multiplier which is configured to produce an output current $i_O$ representing a product of a first input voltage vx and a second input voltage $v_y$.

According to the Gilbert principle, the following can generally be said about the multiplier 1A. In a first unit, the first input voltage vx is converted with transconductance G11 into a current change $i_1$, wherein transconductance G11 is operated with a constant bias current $I_{bias1}$. To this current change, a constant bias current $I_{bias2B}$ (of transconductance G2B/G2B') is added and fed as bias current into transconductances G2B and G2B', wherein G2B receives the positively oriented portion of the current change $i_1$ (i.e. the output current of a positive/+ output, corresponding to e.g. $I(v_{muIP})$ in FIG. 2(a)) and G2B' receives the negatively oriented portion of the current change $i_1$ (i.e. the output current of a negative/− output, corresponding to e.g. $I(v_{muIN})$ in FIG. 2(a)). The second input voltage $v_y$ is applied, in both polarities, to a second unit with a transconductance G2A/G2A', wherein transconductance G2A/G2A' is operated with a constant bias current $I_{bias2A}$, respectively. A voltage $v_d$, which is a pre-distorted voltage of the second input voltage $v_y$, is converted with transconductance G2B/G2B' into a current change $i_2$, wherein transconductance G2B/G2B' is operated with bias current corresponding to the respective portion of the current change respectively. The output current changes $i_2$ of transconductance G2B and G2B' (each of which is a pair of differential currents, like $i_1$) are combined with subtraction to form the resulting current $i_O$, which is proportional to the product of the input voltages $v_x$ and $v_y$.

As shown in FIG. 4, the multiplier 1A comprises a first transconductance stage 10 (with transconductance G11) which is configured to input the first input voltage $v_x$ and to output a first pair of differential currents $i_1$, when being supplied with a first fixed bias current $I_{bias1}$, wherein the first transconductance stage 10 comprises a negative feedback network (indicated by FB). Further, the multiplier 1A comprises a pair of second transconductance stages 20 (with transconductance G2A/G2A'), each of which is configured to input the second input voltage $v_y$ and to output a pre-distorted voltage $v_d$ of the second input voltage $v_y$, when being supplied with a second fixed bias current $I_{bias2A}$, wherein each second transconductance stage 20 comprises a negative feedback network (indicated by FB). Further, the multiplier 1A comprises a pair of third transconductance stages 30 (with transconductance G2B/G2B'), each of which is configured to input a voltage corresponding to the pre-distorted voltage $v_d$ of the second input voltage (in the example of FIG. 4, the pre-distorted voltage $v_d$ as such) and to output a second pair of differential currents $i_2$, when being supplied with a bias current corresponding to a respective current of the first pair of differential currents $i_1$. Further, the multiplier 1A comprises a combination network (40) which is configured to generate the output current $i_O$ by combining the second pairs of differential currents $i_2$ from both of the pair of third transconductance stages 30.

Figures 2A, 2B:
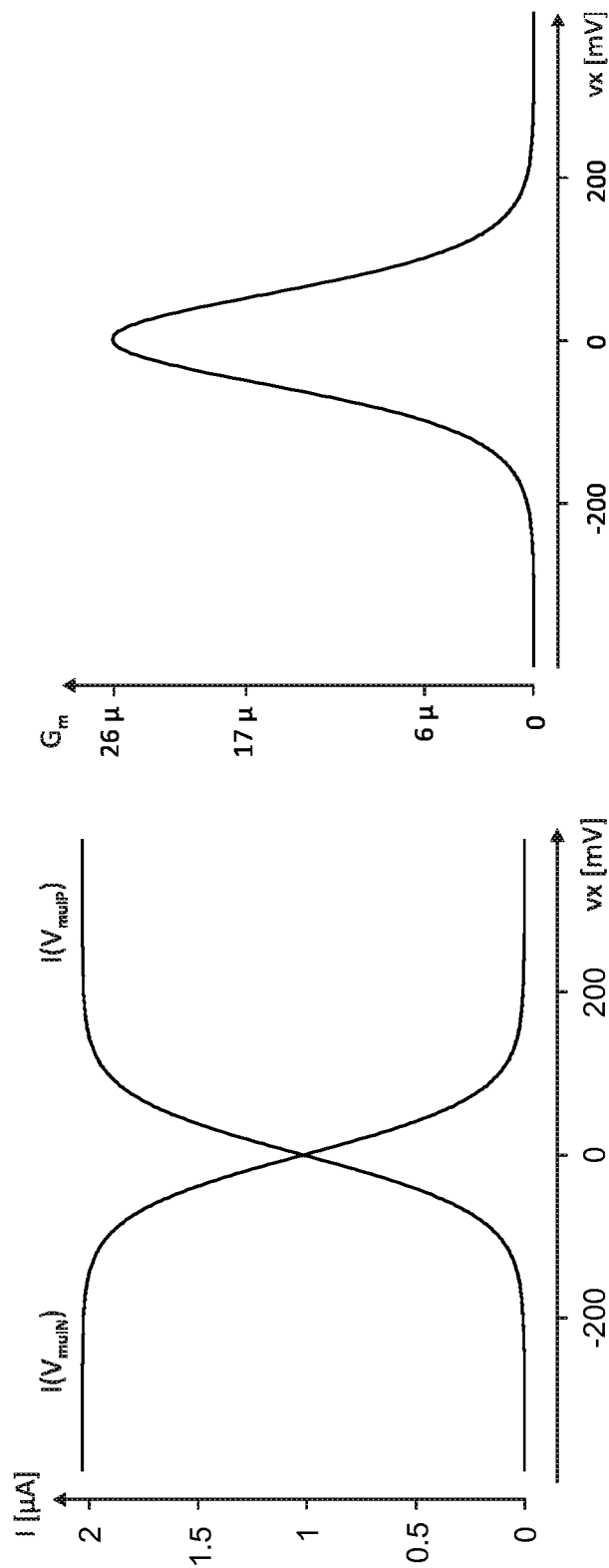
Figure 3B:
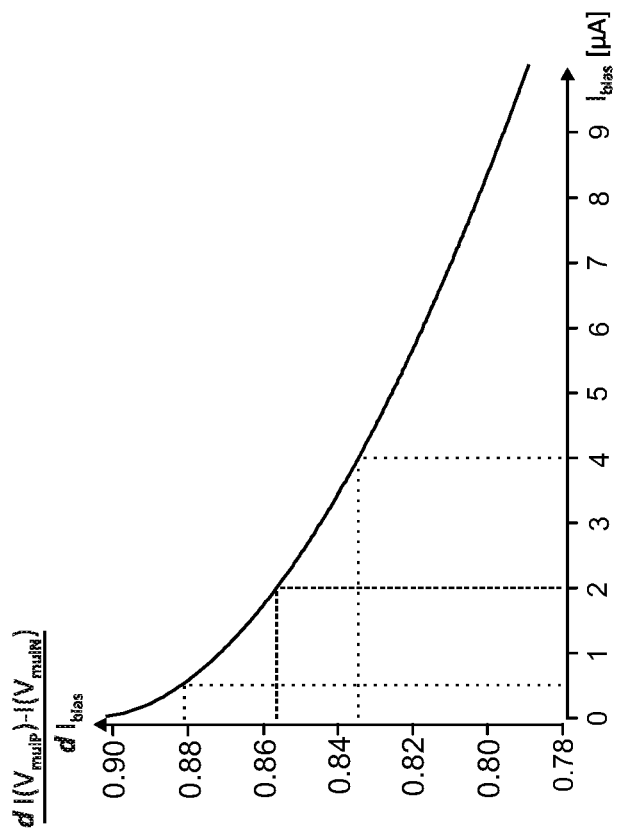
Figure 3A:
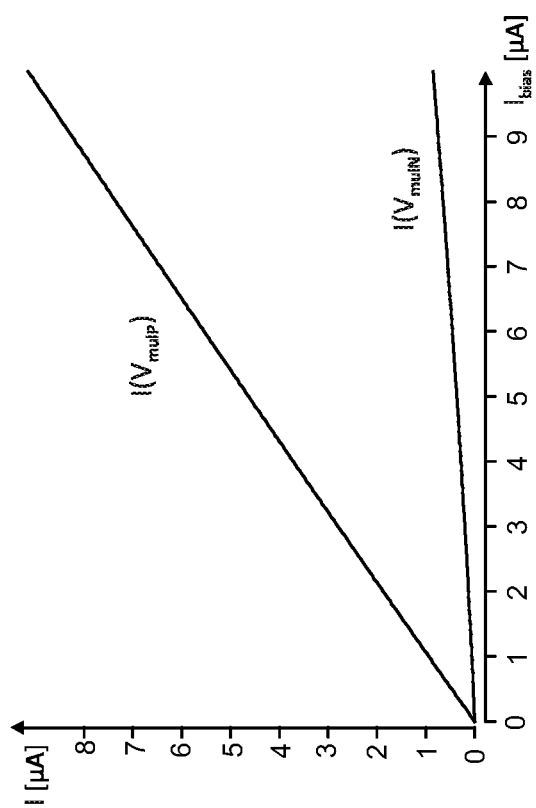

Any one of the aforementioned transconductances G11, G2A/G2A' and G2B/G2B', i.e. the internal transconductance properties of the transconductance elements in the transconductance stages, basically corresponds to $G_m$ in FIG. 2(b).

Although the exemplary circuit structure of FIG. 4 comprises a pair of second transconductance stages 20, it is to be noted that a single second transconductance stage is sufficient when a voltage corresponding to its output, i.e. the pre-distorted voltage $v_d$, is applied to both transconductance stages 30, with corresponding signs/polarities, respectively.

In the exemplary circuit structure of FIG. 4, each transconductance stage can comprise a differential pair, such as a differential pair of CMOS transistors with the respective bias current as common/tail current. Accordingly, each one of transconductance stage 10, 20 and 30, i.e. the respective transconductance G11, G2A/G2A' and G2B/G2B', can be realized in accordance with the circuit structure of FIG. 1.

As is evident from FIG. 4, the multiplier 1A comprises a linearized voltage-input unit for inputting the first input voltage $v_x$, which corresponds to the first transconductance stage 10, and a linearized voltage-input unit for inputting the second input voltage $v_y$, which corresponds to a combination of the at least one second transconductance stage 20 and a respective third transconductance stage 30. That is to say, the overall transfer function of the voltage-input units is linearized, although their internal transconductance properties (i.e. the transconductances G11, G2A/G2A' and G2B/G2B') are highly non-linear, as is evident from FIG. 2(b).

In the following, the linearization of the voltage-input units, i.e. their overall transfer functions or transconductance properties, according to the present disclosure is explained.

Figure 5:
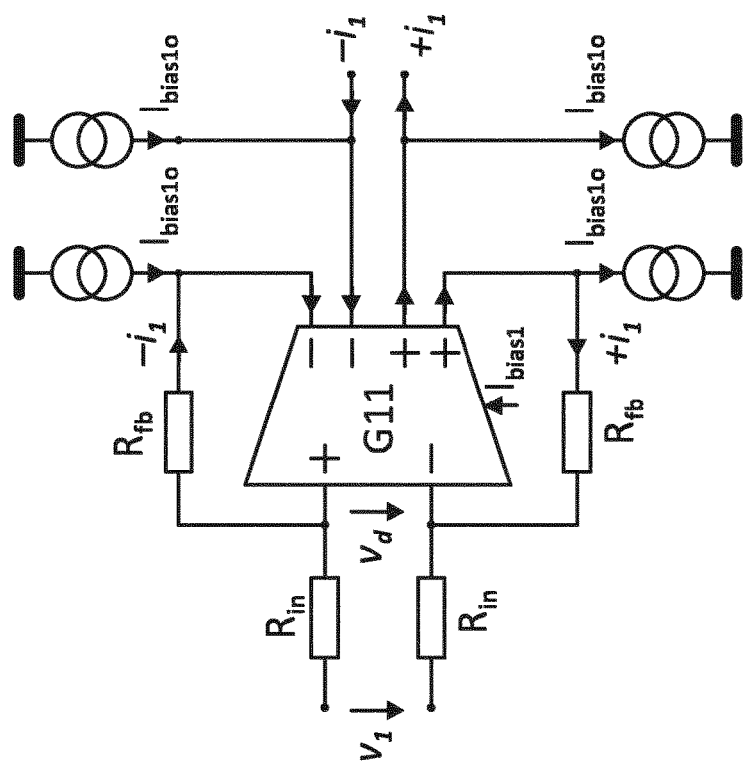
FIG. 5 shows an example of a circuit diagram of a voltage-input unit which is applicable in a multiplier according to an embodiment.

FIG. 5 shows an example of a circuit diagram of a voltage-input unit which is applicable in a multiplier according to an embodiment. The voltage-input unit 15 shown in FIG. 5 represents a transconductance stage with a negative feedback network, and can be used as a first transconductance stage 10 in the multiplier of FIG. 4.

As shown in FIG. 5, the transconductance G11 is given a parallel output at the positive and negative output, which outputs the same current, i.e. $+i_1$ or $-i_1$. Circuits with identical positive and negative current output have a similarity to current conveyors, and identical currents can be realized, for example, with current mirrors in CMOS technology. Each output current, i.e. $+i_1$ or $-_1$, is compared with a reference current $I_{bias1o}$ by subtracting them from each other. The reference current $I_{bias1o}$ is identical in amount to the current $i_1$ at the operating point, e.g. at an input differential voltage of 0.

When an input differential voltage $v_1$ is applied, a voltage swing is generated at the output of the transconductance G11, where $i_1$ and $I_{bias1o}$ are combined. This causes a current flow through feedback resistor/resistance $R_{fb}$ and causes a negative feedback together with the input resistor/resistance $R_{in}$.

The output voltage of the transconductance G11 is not primarily relevant, since the current of the second identical output is evaluated. Nevertheless, the transconductance G11 can be regarded as an inverting voltage amplifier. In order to calculate the transconductance of the inverting circuit, the current difference generated by $I_{bias1o}$–$i_1$ can be allowed to flow via the feedback resistor/resistance Rfb and the input resistor/resistance Rin to input $v_1$. Since the direct input differential voltage at the transconductance G11, i.e. the voltage $v_d$, is regulated to a small value by the negative feedback, the input resistor/resistance Rin determines the overall transconductance. Due to the negative feedback, the resulting overall transconductance hardly depends on the transconductance of the differential pair in the transconductance stage (which corresponds to $G_m$ in FIG. 2(b)). Accordingly, the non-linearity caused by the voltage control of the differential stage due to the very nonlinear $G_m$ can be dispelled or at least significantly mitigated by way of the negative feedback.

Therefore, the unit 15 and its overall transfer function or transconductance property, namely the current-voltage transfer function (i.e. the conversion from $v_1$ or $v_x$ to $i_1$), can be linearized with the exemplary circuit structure of FIG. 5.

Figure 6:
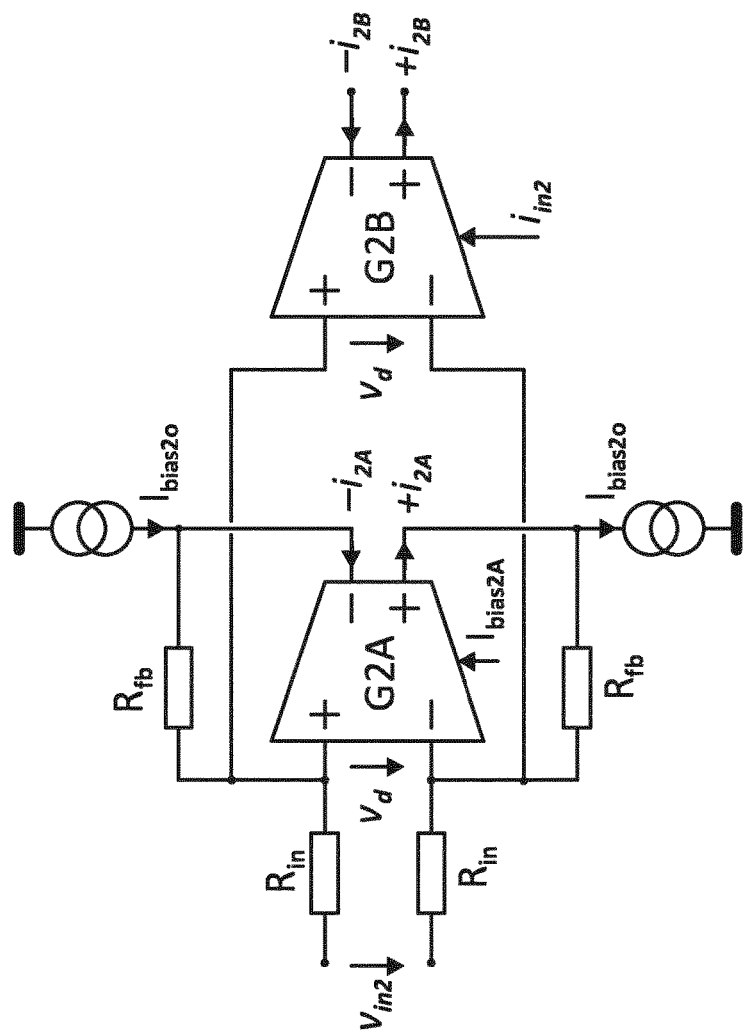
FIG. 6 shows an example of a circuit diagram of another voltage-input unit which is applicable in a multiplier according to an embodiment.

FIG. 6 shows an example of a circuit diagram of another voltage-input unit which is applicable in a multiplier according to an embodiment. The voltage-input unit 25 shown in FIG. 6 represents a coupling of a transconductance stage with a negative feedback network and a subsequent transconductance stage (without a negative feedback network), and can be used as a combination of second and third transconductance stages 20 and 30 in the multiplier of FIG. 4.

As shown in FIG. 6, two transconductance stages are used in concatenation, which are featured in that their transconductances G2A and G2B have the same properties. Having the same properties can mean or comprise that a transconductance of a preceding transconductance stage is at least substantially equal to a transconductance of a subsequent transconductance stage which is configured to input the voltage based on the (pre-distorted) voltage from the preceding transconductance stage. Additionally or alternatively, having the same properties can mean or comprise that a preceding transconductance stage and a subsequent transconductance stage which is configured to input the voltage based on the (pre-distorted) voltage from the preceding transconductance stage are matched to each other. Such equivalence of properties can be achieved by arranging the two input portions/stages of G2A and G2B side by side in the physical layout, or even by arranging the transistors together in a so-called quad layout or inter-digitated layout.

Similar to the case of FIG. 5, an output current of the transconductance G2A, i.e. $+i_{2A}$ or $-i_{2A}$, is compared with a reference current $I_{bias2o}$ by subtracting them from each other. The reference current $I_{bias2o}$ is identical in amount to the current $i_{2A}$ at the operating point, e.g. at an input differential voltage of 0. When an input differential voltage $v_{in2}$ is applied, a voltage swing is generated at the output of the transconductance G2A, where $i_2$ and $I_{bias2o}$ are combined. This causes a current flow through feedback resistor/resistance $R_{fb}$ and causes a negative feedback together with the input resistor/resistance $R_{in}$.

The transconductance G2A is operated/supplied with a fixed bias current $I_{bias2A}$. The bias current $I_{bias2A}$ is preferably chosen to be in the middle of the operating range of the bias current of the subsequent transconductance G2B, i.e. the variable signal input current $i_{in2}$. Further, the bias current $I_{bias2A}$ can be chosen to minimize the non-linearity of the signal input $i_{in2}$, which is already low when coming from a linearized transconductance stage like that shown in FIG. 5.

At the same time, the gain of the transconductance G2A is preferably selected to be significantly smaller than ∞ so that the feedback around the transconductance G2A at the direct input thereof causes the voltage $v_d$ to be set so that it generates the same current in the transconductance G2B as in the transconductance G2A, i.e. $i_{2A}=i_{2B}$. With a normal operational amplifier circuit, the gain, or more precisely the Gm of the input differential stage, would be set as high as possible, so that the voltage gain would ideally become ∞ to minimize $v_d$ and thus obtain the highest possible linearity. Here, however, the gain should only be chosen high enough to minimize $v_d$ only so far to achieve sufficient linearity at the input level of the input differential voltage $V_{in2}$. Referring to FIG. 6, it can be said that the transconductance G2A of the second transconductance stage and the transconductance G2B of the third transconductance stage should be chosen not too high, i.e. sufficiently low, so as to enable a mutual matching of/between the second and third transconductance stages. More specifically, the Gm of the input differential stage of the second and third transconductance stages should be chosen such that Vgs–Vth of its transistors is not too small such that a mismatch of Vth between the transistors (of the two transconductance stages) does not (at least, not excessively or overly) affect the mutual matching of/between the second and third transconductance stages.

Thus, the transconductance G2B represents a transconductance stage linearized by a pre-distortion due to the negative feedback in the preceding transconductance G2A.

Hence, the transconductance G2A can be regarded as a multiplier (which can also be considered as an amplifier with adjustable gain) that multiplies $v_{in2}$ by $I_{bias2A}$, wherein $I_{bias2A}$ is constant and only $v_{in2}$ is variable. By the negative feedback by way of the feedback resistor/resistance Rfb and the input resistor/resistance Rin, linearization is achieved and $v_d$ is (pre-) distorted accordingly. The multiplication of voltage and variable current is then realized by the transconductance G2B by processing the variable current $i_{in2}$ with the pre-distorted voltage $v_d$. Accordingly, the non-linearity caused by the voltage control of the differential stage due to the very nonlinear $G_m$ can be dispelled or at least significantly mitigated by way of the (pre-)distortion by the preceding differential stage and its negative feedback.

Accordingly, the unit 25 and its overall transfer function or transconductance property, namely the current-voltage transfer function (i.e. the conversion from $v_{in2}$ or $v_y$ to $i_{2B}$), can be linearized with the exemplary circuit structure of FIG. 6. That is, the transconductance stage of transconductance G2B, which is stacked on top of the transconductance stage of transconductance G11, can be linearized in that it is driven with a (pre-)distorted voltage which compensates for the non-linearity of the voltage drive.

Figure 7:
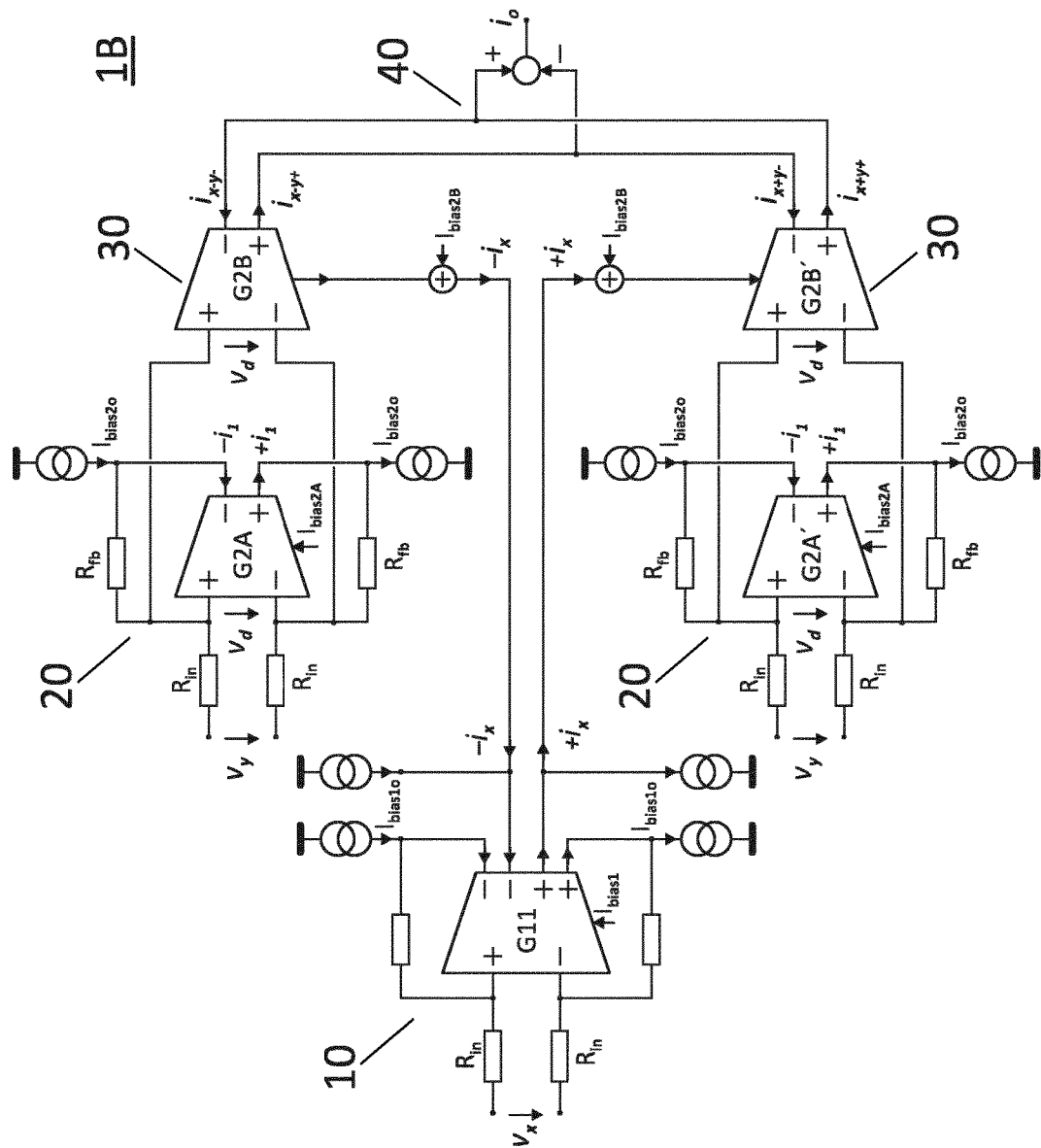
FIG. 7 shows another example of a circuit diagram of a multiplier according to an embodiment.

FIG. 7 shows another example of a circuit diagram of a multiplier according to an embodiment. Similar to FIG. 4, the multiplier shown in FIG. 7 is an analog multiplier which is based on transconductances or, stated in other terms, an analog multiplier based on the Gilbert principle (i.e. a Gilbert-type multiplier), and is an analog multiplier which is configured to produce an output current $i_0$ representing a product of a first input voltage $v_x$ and a second input voltage $v_y$.

As shown in FIG. 7, the multiplier 1B has a basic configuration similar to that of the multiplier 1A of FIG. 4. Namely, the multiplier 1B comprises a first transconductance stage 10, a pair of second transconductance stages 20, a pair of third transconductance stages 30, and a combination network 40, which have the same/equivalent functionalities and structures as described above in connection with FIG. 4. Hence, a detailed description thereof is omitted.

More specifically, the multiplier 1B has a configuration in which a linearized voltage-input unit 15 as shown in FIG. 5 is adopted for the first transconductance stage 10, and a linearized voltage-input unit 25 as shown in FIG. 6 is adopted for both pairs of the second and third transconductance stages 20 and 30, respectively. Stated in other terms, the linearized transconductance of FIG. 5 for the first (lower) stage of stacked (or cascaded) transconductance is connected to the second (upper) stage of stacked (or cascaded) transconductance, which is driven by a variable current, like in the linearized transconductance unit of FIG. 6. Hence, for a detailed description, reference can be made to the description of FIGS. 5 and 6, in addition to the description of FIG. 4.

In brief, the functionality of the multiplier 1B can be outlined as follows. The multiplier 1B has two input voltages, namely $v_x$ and $v_y$. The input voltage $v_x$ is converted by means of the linearized transconductance G11 into a current $i_x$, which is fed, as second factor for product formation, with complementary sign into the transconductances G2B and G2B' as bias current. For operating point adjustment, a current $I_{bias2B}$ is added to the variable current $i_x$. The multiplier stages G2B and G2B' are controlled by the pre-distortion stages G2A and G2A', which each provide a voltage $v_d$ at the transconductances G2B and G2B' and ensure a linearized $v_y$ control of the multiplier stages. Since $v_d$ at the inputs of the transconductance stages G2B and G2B' are identical, the transconductance stage G2A' can be saved, and the voltage $v_d$ generated by the transconductance stage G2A can be fed not only to the transconductance stage G2B but also to the transconductance stage G2B'.

Figure 8:
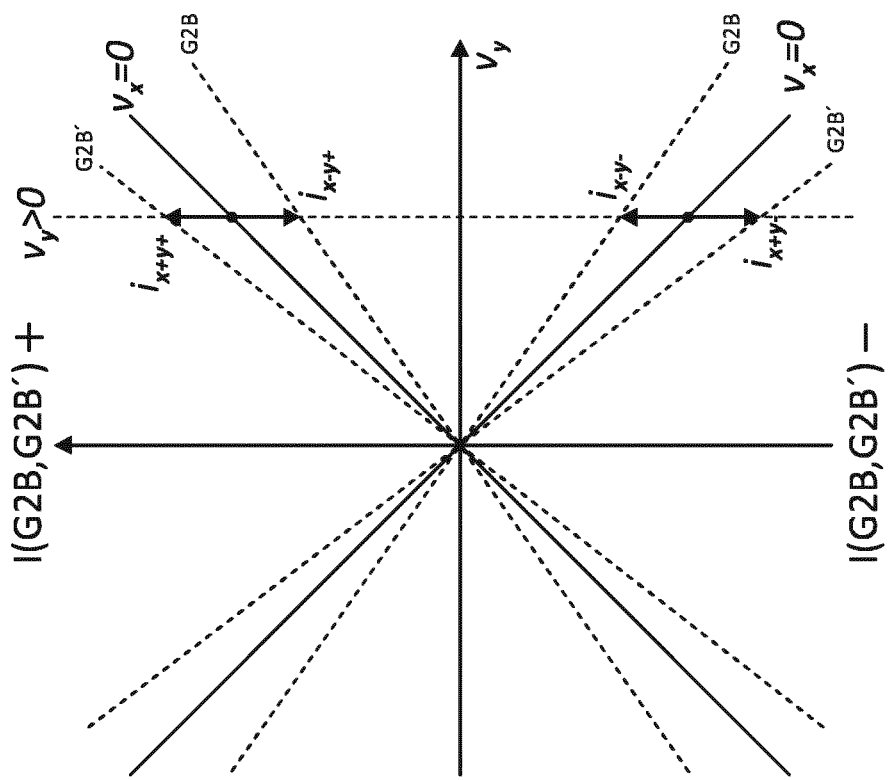
FIG. 8 shows an example of a modulation characteristic of the multiplier in line with the circuit diagram of FIG. 7 according to an embodiment.

FIG. 8 shows an example of a modulation characteristic (i.e. the signal changes) of the multiplier in line with the circuit diagram of FIG. 7 according to an embodiment.

The values on the y-axis are the currents of the positive and negative outputs of the transconductance stages G2B and G2B'. The second input voltage $v_y$ is plotted on the x-axis, and the operating point is marked on the bisecting line of the angle when $v_x=0$ and $v_y>0$.

In the first quadrant are the current components for y+>0, and in the fourth quadrant are the current components for y−<0. In case of $v_x>0$, the operating lines of the transconductance stage G2B' turn to larger absolute values ($i_{x+y+}$, $i_{x+y-}$), and the operating lines of the transconductance stage G2B turn to smaller absolute values ($i_{x-y+}$, $i_{x-y-}$). To calculate the product, the currents $i_{x+y+}$ are connected to $i_{x--}$, and the currents $i_{x-y+}$ to $i_{x+y-}$, and then subtracted from each other, as shown in FIG. 7.

Accordingly, the combination network 40 can be configured to generate the output current (representing a product of a first input voltage and a second input voltage) by appropriately combining respective currents (or, differential currents). Namely, by appropriately connecting signal lines carrying respective currents, these currents are (implicitly) added/subtracted. When combining differential currents, a differential-to-unipolar conversion is also performed by the combination network 40 when a unipolar (singular) output current is intended to be generated as output. Accordingly, the combination network 40 generates the output current by subtracting a value, which is obtained by/as a combination of a positively oriented portion of an output current (i.e. the output current of a positive/+ output) of a third transconductance stage (which is operated/supplied with a negatively oriented portion of an output current (i.e. the output current of a negative/− output) of the first transconductance stage) with a negatively oriented portion (i.e. the output current of a negative/− output) of an output current of a third transconductance stage (which is operated/supplied with a positively oriented portion of an output current (i.e. the output current of a positive/+ output) of the first transconductance stage), from a value, which is obtained by/as a combination of a negatively oriented portion of an output current (i.e. the output current of a negative/− output) of a third transconductance stage (which is operated/supplied with a negatively oriented portion of an output current (i.e. the output current of a negative/− output) of the first transconductance stage) with a positively oriented portion (i.e. the output current of a positive/+ output) of an output current of a third transconductance stage (which is operated/supplied with a positively oriented portion of an output current (i.e. the output current of a positive/+ output) of the first transconductance stage).

Figure 9:
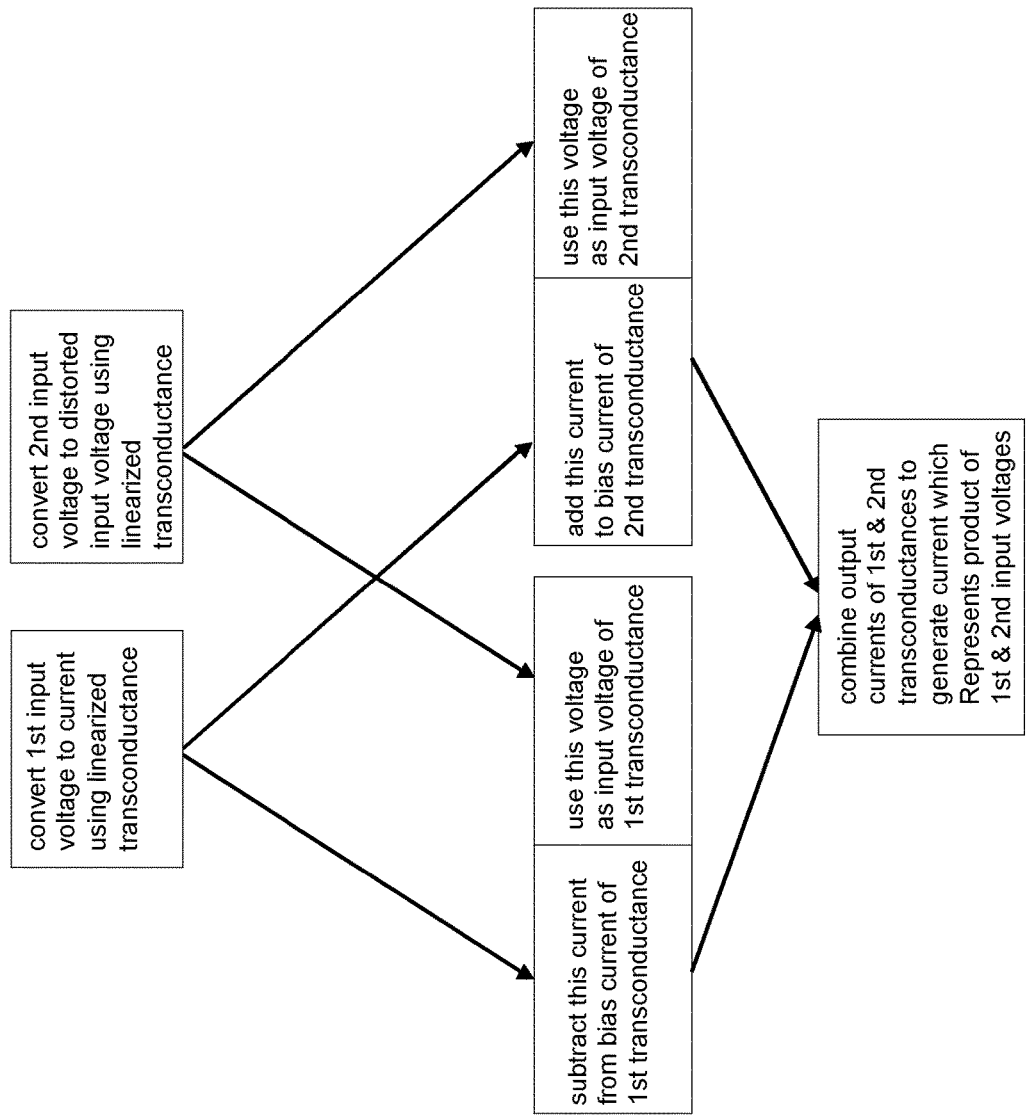
FIG. 9 shows an example of an operating process or signal flow of the multiplier in line with the circuit diagram of FIG. 7 according to an embodiment.

FIG. 9 shows an example of an operating process or signal flow of the multiplier in line with the circuit diagram of FIG. 7 according to an embodiment. Namely, FIG. 9 shows an operating process or signal flow of a linearized multiplier according to an embodiment.

The schematic diagram shown in FIG. 9 illustrates the operation of the multiplier in line with the circuit diagram of FIG. 7, i.e. the operating process (i.e. method of operating the multiplier) or the signal flow thereof. As the thus shown operation is merely an illustration of what is described before in terms of the operability of the multiplier and its parts, the contents of FIG. 9 is held to be self-explanatory for the skilled person such that a detailed description thereof is omitted while making reference to the above description in connection with FIG. 7 (as well as FIGS. 4 to 6).

By way of example, referring to FIG. 7, the stage 10 converts the first input voltage to a current using the linearized transconductance, and any one of stages 20 converts the second input voltage to a (pre-)distorted voltage using the linearized transconductance. The current from the stage is subtracted from a bias current of a first transconductance of the upper stage 30, and the upper stage 30 uses the (pre-)distorted voltage from the upper stage 20 as input voltage. The current from the stage 10 is added to a bias current of a second transconductance of the lower stage 30, and the lower stage 30 uses the (pre-)distorted voltage from the lower stage 20 as input voltage. Then, the combination network 40 combines the outputs from the first and second transconductances, i.e. the upper and lower stages 30.

Figure 10:
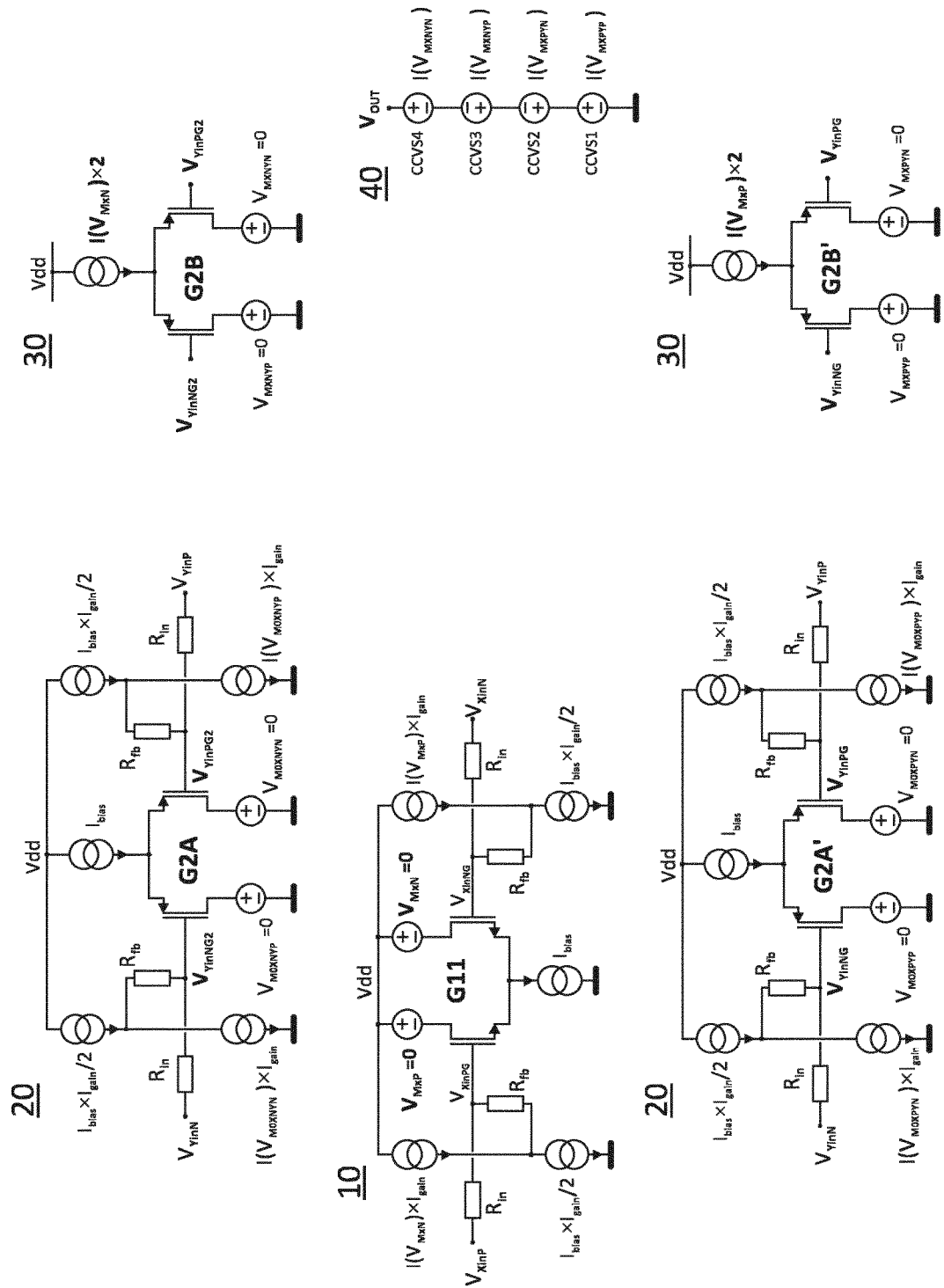
FIG. 10 shows examples of transistor circuits of various parts of/for an multiplier according to an embodiment.

FIG. 10 shows examples of transistor circuits of various parts of/for a multiplier according to an embodiment. That is, any one of the transistor circuits shown in FIG. 10 can be implemented/realized alone or in a multiplier such as any one of the multipliers 1A, 1B and 1C exemplified herein.

As shown in FIG. 10, the parts of a multiplier can be realized with CMOS transistors. In FIG. 10, the same reference numerals as in FIG. 7 are used for denoting parts serving as corresponding stages or units of a multiplier, respectively. The relationship/connection between the individual parts, when being integrated into a multiplier as shown in FIG. 7, becomes evident from the mutually corresponding denominations of their signals. For example, the currents I($V_{M \times P}$) and I($V_{M \times N}$) in part 10 serving as a first transconductance stage are fed as currents to part 30 serving as a third transconductance stage, and the voltages $V_{YinPG2}$ and $V_{YinNG2}$ in part 20 serving as a second transconductance stage are input as voltages to part 30 serving as a third transconductance stage, respectively.

In order for the multiplier (resulting from a combination of the parts shown in FIG. 10) to work with low supply voltages, the first transconductance stage 10, i.e. the differential pair of transconductance G11, is built with NMOS transistors, namely with a NMOS input stage/portion, and the second and third transconductance stages 20 and 30, i.e. the differential pair of transconductances G2A, G2A', G2B and G2B', are built with PMOS transistors, namely with a PMOS input stage/portion, respectively. Any current mirrors and loads are not realized on transistor level here but with dummy voltage sources with a voltage of 0 V. These dummy voltage sources with the designations $V_M$ . . . are used to measure the respective current that controls the current-controlled current sources I($V_M$ . . . ). For example, $V_{M \times P}$ and $V_{M \times N}$ measure the current of the first transconductance G11, and these currents are reproduced with I($V_{M \times N}$) in transconductance G2B and I($V_{M \times P}$) in transconductance G2B'. On transistor level, this function can be realized with current mirrors.

In the first transconductance stage 10, the first transconductance G11 processes the first input voltage $v_x$, which is applied as $V_{XinP}$ and $V_{XinN}$ to the input of and G11. Firstly, the generated currents of the first transconductance G11 are used to control the tail current of the transconductances G2B' and G2B, i.e. as output current. Secondly, for realizing a negative feedback, the generated currents of the first transconductance G11 are compared with bias current source $I_{bias} \times I_{gain}/2$. The factor $I_{gain}$ is used to adjust the gain and hence the level of negative feedback of the first transconductance G11, and thus controls the level of linearization of the first transconductance G11.

In the second and third transconductance stages 20 and 30, the gate nodes $V_{YinNG}$ and $V_{YinPG}$ of the transconductances G2A' and G2B' are connected to each other via the labels on the wires. The same applies to the gate nodes $V_{YinNG2}$ and $V_{YinPG2}$ for the transconductances G2A and G2B. The transconductances G2A' and G2A generate voltages through the negative feedback network at the input nodes of the differential stage, which cause differential currents in the matched transconductances G2B' and G2B that are proportional to the second input voltage $v_y$. Since the operating current of the transconductances G2B' and G2B, which is controlled by the first transconductance stage 10, is proportional to the first input voltage $v_x$, a multiplication of the input voltages $v_x$ and $v_y$ is effectively performed in the transconductances G2B' and G2B. Then, in the combination network 40, the results of the differential currents of the transconductances G2B' and G2B are combined by means of current-controlled voltage sources CCVS1 to CCVS4 with the correct sign to obtain the multiplication result VOUT.

Figure 11:
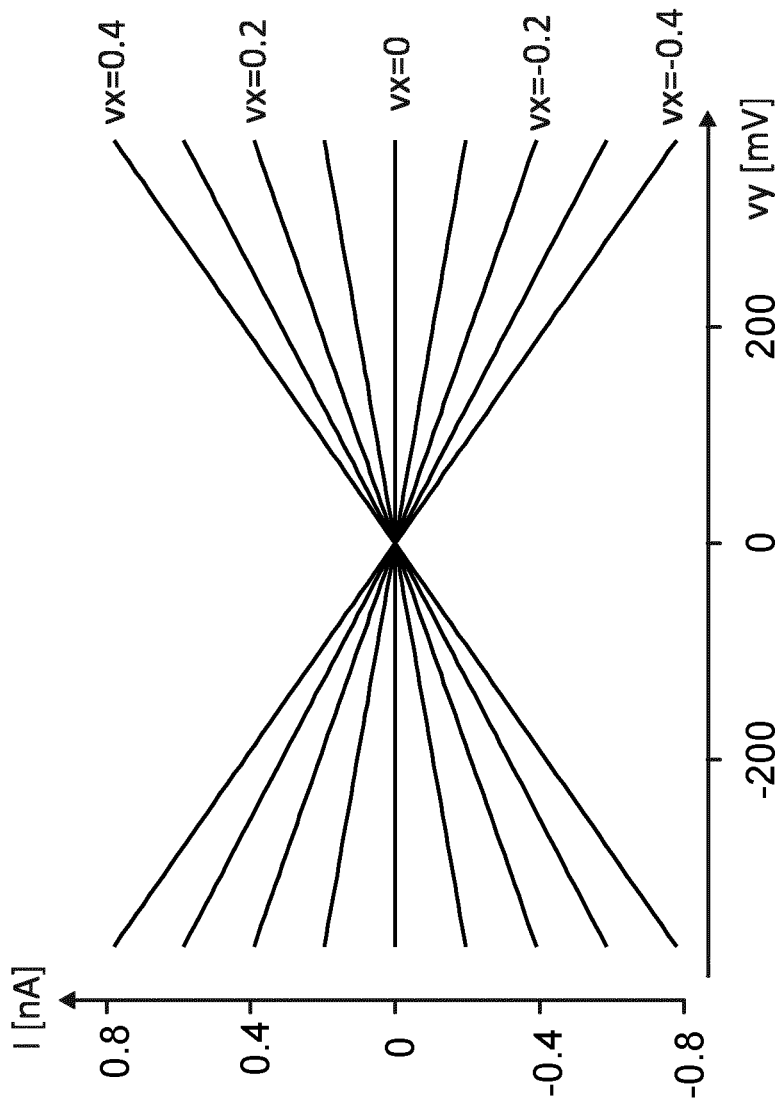
FIG. 11 shows an example of a modulation characteristic of the multiplier in line with the transistor circuits of FIG. 10 according to an embodiment.

FIG. 11 shows an example of a modulation characteristic of the multiplier in line with the transistor circuits of FIG. 10 according to an embodiment, namely a result of a transistor simulation.

As shown in FIG. 11, the second input voltage $v_y$ is varied on the x-axis, and the first input voltage $v_x$ is changed as a parameter in steps of 100 mV. The straight lines and the equidistant y-sections at $v_y = \pm 400$ mV, show the accuracy of the multiplier in the realization as shown in FIG. 10.

Due to the multiplication of small numerical values, i.e. the multiplication of currents in the μA range, small numerical values in the nV range are produced in the model of the multiplier with the current-controlled voltage sources of the multiplier in the realization as shown in FIG. 10, which, however, produce considerably larger voltage levels in a real transistor circuit.

Figure 12:
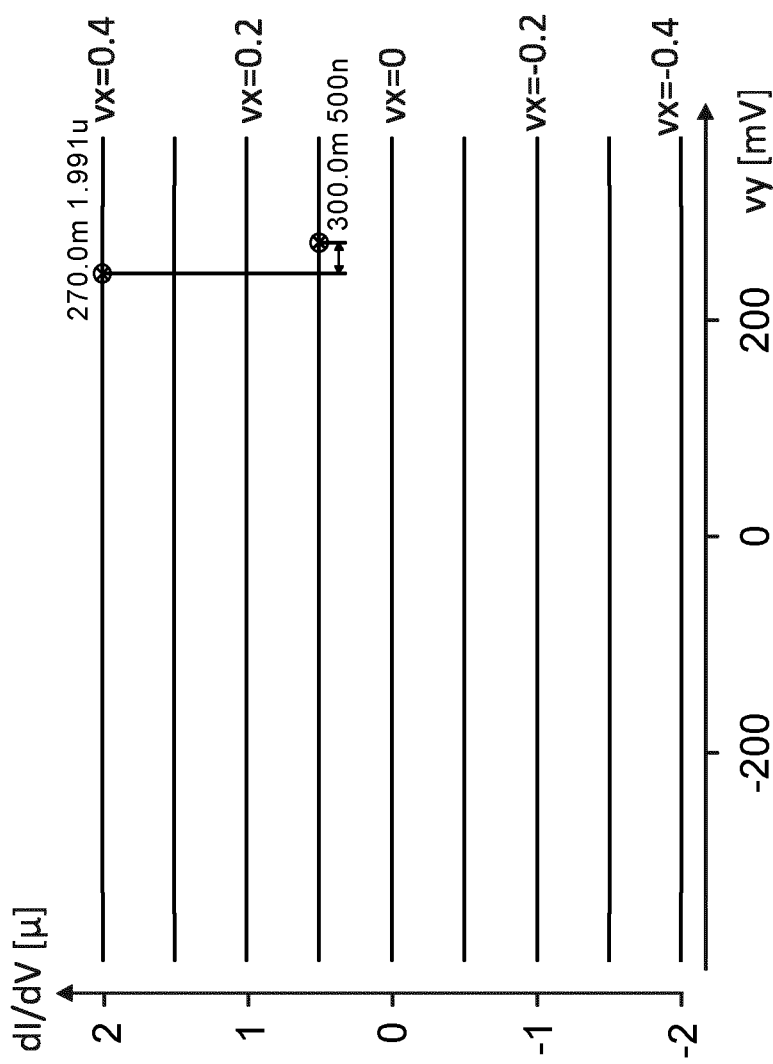
FIG. 12 shows an example of a linearity characteristic of the multiplier in line with the transistor circuits of FIG. 10 according to an embodiment.

FIG. 12 shows an example of a linearity characteristic of the multiplier in line with the transistor circuits of FIG. 10 according to an embodiment, namely a result of a transistor simulation.

As shown in FIG. 12, the linearity of multiplier in the realization as shown in FIG. 10 can be recognized from the plotted derivation of the characteristic curves. The derivatives are exactly equidistant at 0.5μ, and even at a level of $v_y = 270$ mV and $v_x = 400$ mV (i.e. the upper marker), the deviation of the derivative from the nominal value of 2.00μ is less than 0.5% at 1.991μ. At a level of $v_y = 300$ mV and $v_x = 100$ mV (i.e. the lower marker), the derivate does not even show any deviation but lies at the nominal value of 500 n such that no error is present at this point.

As explained above, a multiplier with improved linearity, especially a Gilbert-type multiplier in CMOS technology, can be realized with the circuit structures of FIG. 4, 7 or 9. However, the linearity can still be further enhanced, as is explained below.

When linearizing the transconductances G2B and G2B' by the transconductances G2A and G2A', i.e. providing the voltage-input unit 25, as shown in FIGS. 6 and 7, it is assumed that the voltage $v_d$ formed by the transconductance G2A/G2A' corresponds exactly to the inverse function of the transconductance G2B/G2B', which converts the voltage $v_d$ at its input into the currents $i_{x-y+}$ and $i_{x-y+}$. Yet, this assumption would only be valid if the transconductance property $G_m$ in the transconductance element G2B is exactly proportional to the bias current $I_{bias2B} - i_x$, and the transconductance property $G_m$ in the transconductance element G2B' is exactly proportional to the bias current $I_{bias2B} + i_x$. Due to the finite amplification of the transconductance G2A/G2A', there are however further possible deviations from the desired inverse function.

Figure 13:
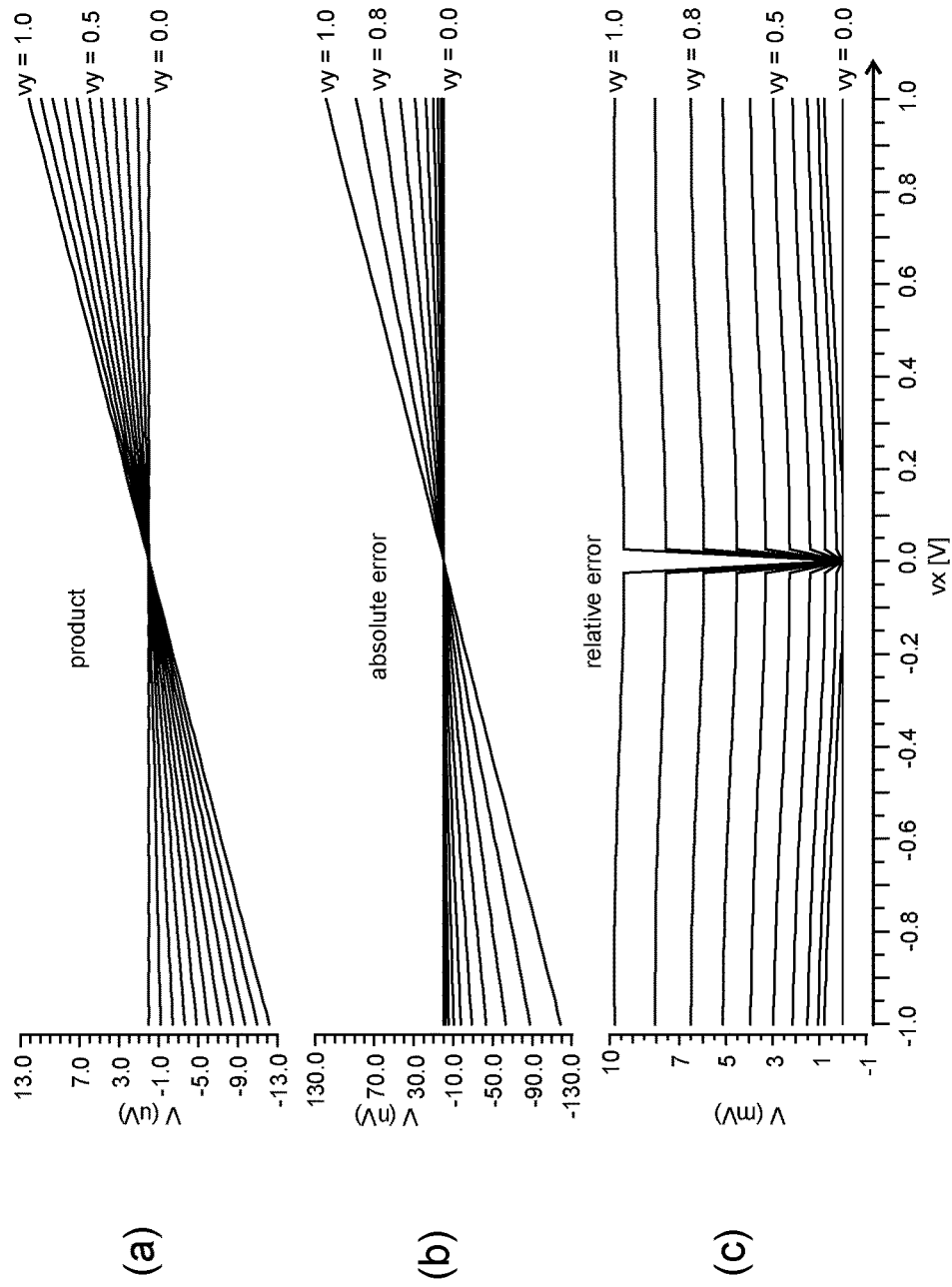
FIG. 13 shows examples of error characteristics with respect to a first input voltage of the multiplier in line with the circuit diagram of FIG. 7 according to an embodiment.
Figure 14:
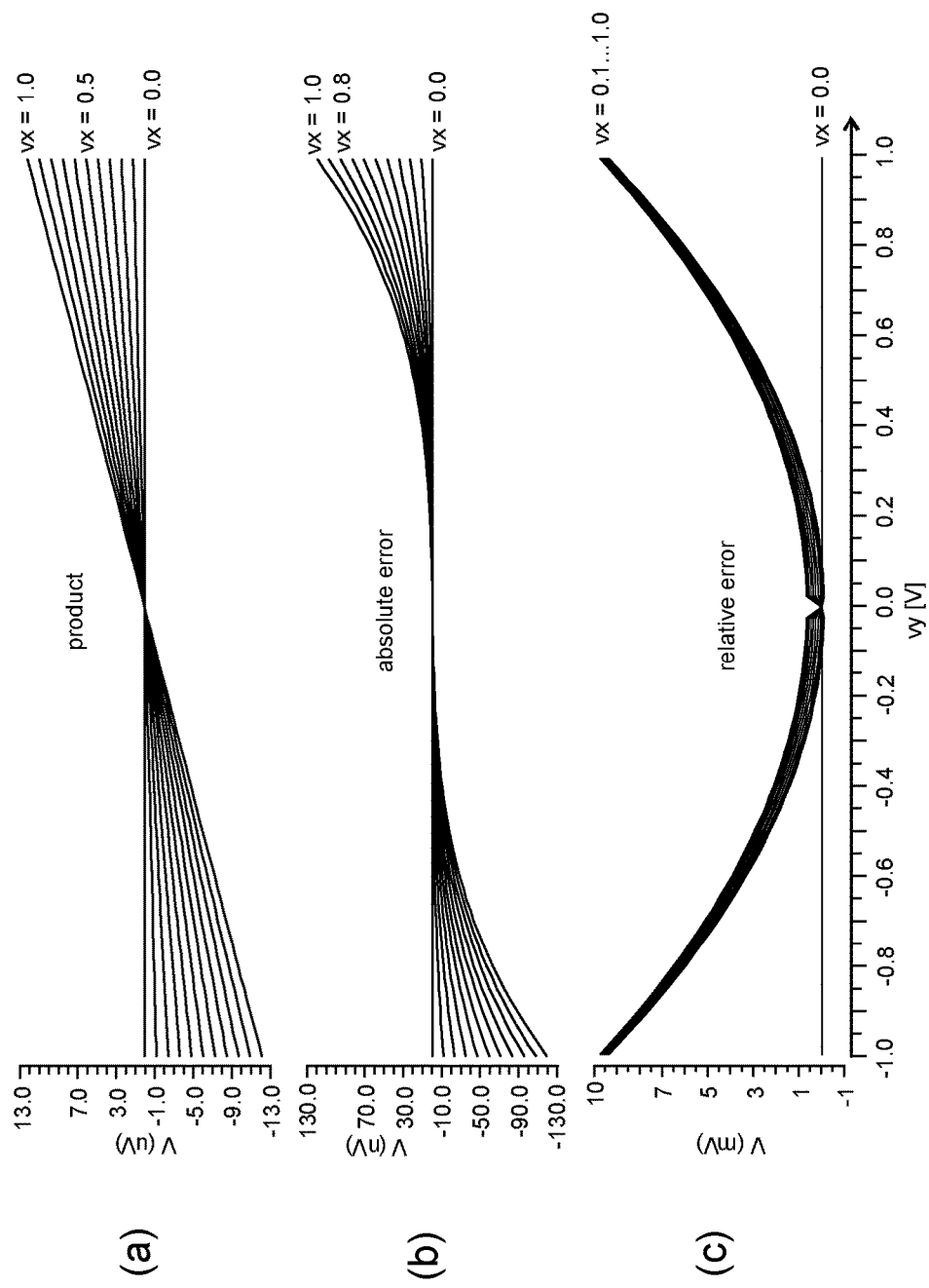
FIG. 14 shows examples of error characteristics with respect to a second input voltage of the multiplier in line with the circuit diagram of FIG. 7 according to an embodiment.

FIG. 13 shows examples of error characteristics with respect to a first input voltage of the multiplier in line with the circuit diagram of FIG. 7 according to an embodiment, and FIG. 14 shows examples of error characteristics with respect to a second input voltage of the multiplier in line with the circuit diagram of FIG. 7 according to an embodiment. That is, FIGS. 13 and 14 represent results of simulations based on the circuit diagram of FIG. 7 (with an implementation of the individual parts/units in line with the transistor circuits as illustrated in FIG. 10).

As shown in FIG. 13, the first input voltage $v_x$ is traversed from −1 V to +1 V, the second input voltage $v_y$ is the parameter that is increased from 0 V to 1 V with a step size of 0.1 V. The individual graphs in FIG. 13 are from top to bottom: a multiplication result in FIG. 13(a), an absolute error in FIG. 13(b) and a relative error in FIG. 13(c).

As shown in FIG. 14, the second input voltage $v_y$ is traversed from −1 V to +1 V, the second input voltage $v_x$ is the parameter that is increased from 0 V to 1 V with a step size of 0.1 V. The individual graphs in FIG. 14 are from top to bottom: a multiplication result in FIG. 14(a), an absolute error in FIG. 14(b) and a relative error in FIG. 14(c).

As a basis for the error calculation, multiplication coefficients calculated at $v_x$=0.1 V and $v_y$=0.1 V are used. From FIG. 13(c), the following can be recognized: For large $v_y$, the error hardly depends on $v_x$ and is up to 1%, corresponding to $10 \times 10^{-3}$=10 mV. In case of $v_y$=100 mV, the relative error ranges between 0 at $v_x$=100 mV, because the error calculation is normalized to 100 mV, and a maximum of about 0.1%. The relative error curves in FIG. 13(c) are not equidistant. This fact is reflected in the approximate parabolic shape of the relative error, if $v_y$ is varied continuously and $v_x$ is used as the parameter that is changed stepwise from 0 V to 1 V. Such an error curve is shown in FIG. 14(c).

In view of such findings, the linearization of the transconductances G2B and G2B' by the transconductances G2A and G2A', can be further improved.

According to an embodiment, a multiplier comprises an error compensating circuit which is configured to generate a compensated voltage for compensating an error in the output current with respect to an exact algebraic product of the first input voltage and the second input voltage.

Figure 15:
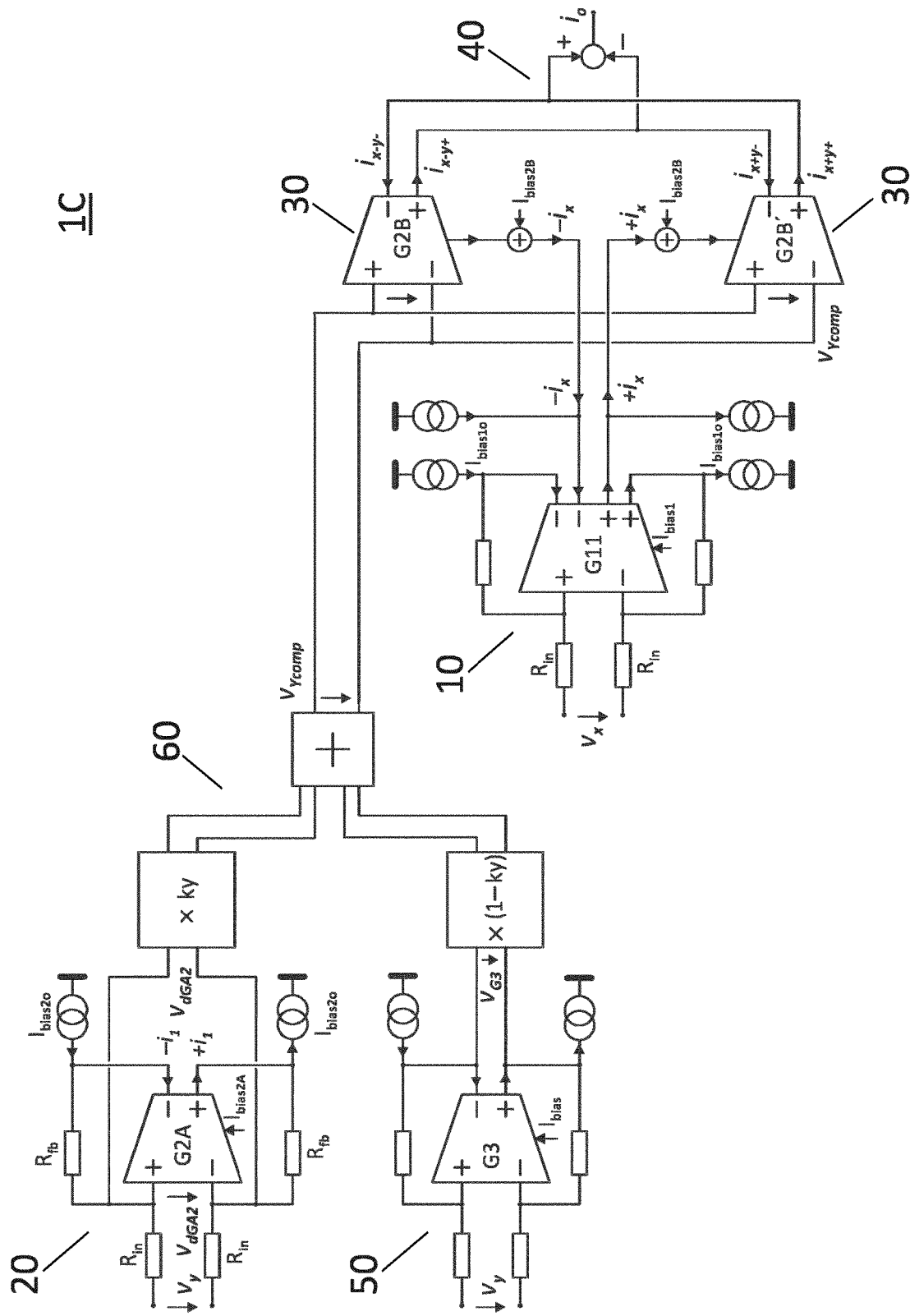
FIG. 15 shows still another example of a circuit diagram of a multiplier according to an embodiment.

FIG. 15 shows still another example of a circuit diagram of a multiplier according to an embodiment. Similar to FIGS. 4 and 7, the multiplier shown in FIG. 15 is an analog multiplier which is based on transconductances or, stated in other terms, an analog multiplier based on the Gilbert principle (i.e. a Gilbert-type multiplier), and is an analog multiplier which is configured to produce an output current $i_O$ representing a product of a first input voltage $v$, and a second input voltage $v_y$.

As shown in FIG. 15, the multiplier 1C has a basic configuration similar to that of the multiplier 1B of FIG. 7. Namely, the multiplier 1C comprises a first transconductance stage 10, a second transconductance stage 20, a pair of third transconductance stages 30, and a combination network 40, which have the same/equivalent functionalities and structures as described above in connection with FIGS. 4 and 7. Hence, a detailed description thereof is omitted. It is to be noted that in the circuit structure of FIG. 15, a single second transconductance stage 20 is used for providing a pre-distorted voltage of the second input voltage, and a voltage based on this pre-distorted voltage (i.e. a compensated voltage $v_{Ycomp}$) is input to both of the pair of third transconductance stages 30, respectively.

As compared with the circuit structure of FIG. 7, the multiplier 1C of FIG. 15 is however extended by a compensation circuit, which is configured to reduce the error (which error reduction can, by way of simulations, be by a factor of about 10, as is shown below in FIGS. 16 and 17). According to an embodiment, the compensation circuit is realized by a combination of a second transconductance stage 20, a fourth transconductance stage 50 and a multiplication-addition network 60, which in the circuit structure of FIG. 15 replaces a second transconductance stage 20 in the circuit structure of FIG. 7.

As shown in FIG. 15, the compensation circuit in the multiplier 1C generates a compensated voltage $v_{Ycomp}$. Namely, the transconductance stage 20 generates a pre-distorted voltage $v_{dGA2}$, as explained above, and the transconductance stage 50 generates a scaled voltage $v_{G3}$ (by applying a gain, without providing a negative feedback). Then, the pre-distorted voltage $v_{dGA2}$ is multiplied with a factor ky, the scaled voltage $v_{G3}$ is multiplied with a factor (1−ky), and the resulting multiplied voltages are added (by an adder/summator) to produce the compensated voltage $v_{Ycomp}$, i.e. $v_{Ycomp} = v_{dGA2} \times ky + v_{G3} \times (1-ky)$. The thus produced compensated voltage $v_{Ycomp}$ is input to the third transconductance stages 30, i.e. the transconductance G2B and G2B', respectively.

It is to be noted that multiplication with ky and (1−ky) can be realized by a multiplier but does not require a multiplier. Rather, such multiplication can be realized with voltage dividers or potentiometers, since the multiplication is done with a constant.

If ky=1, the output voltage of the transconductance G3 ($v_{G3}$) has no effect, since $v_{G3}$ is multiplied by 0, while the output voltage of the transconductance G2A ($v_{dGA2}$) is used as compensated voltage, since $v_{dGA2}$ is multiplied by 1. The circuit structure of FIG. 15 then has the same function as the circuit structure of FIG. 7.

As explained above, the factor ky for error compensation can be chosen between 0 and 1. If so, the voltages $v_{dGA2}$ and $v_{G3}$ are multiplied by ky and (1−ky), and the sum of the factors ky and (1−ky) is equal to 1. In the illustrated example, which generates the simulation results of FIGS. 13 and 14, ky can preferably be set to 0.45 to achieve optimal error compensation (i.e. error compensation by a factor 10).

However, the factor ky for error compensation can be chosen to be greater than 1, e.g. 10. If so, the voltages $v_{dGA2}$ and $v_{G3}$ are multiplied by ky and 1/ky, and the product of the factors ky and 1/ky is equal to 1, wherein a normalization by the factor ky can preferably be applied subsequently, i.e. before of after the adder/summator.

The factor ky for error compensation can be manually or automatically chosen. For example, the factor ky can be set by a user, operator, designer, etc. in view of simulation and/or test results, or the factor ky can be set by a control circuit (not shown) on the basis of simulations and/or tests, e.g. by way of a feedback control depending on a resulting simulated/tested error value, so as to minimize the error value.

Without additional error compensation, the voltage $V_{dG2A}$ generated by the second transconductance stage 20 would be fed directly to the voltage inputs of the transconductances G2B and G2B'.

A transconductance G2A', i.e. an additional second transconductances stage, as shown in FIG. 7, is not necessary since the transconductances G2A and G2A' generate the same voltage and, thus, the transconductances G2A' is redundant, as indicated above. Anyway, the multiplier 1C can comprise two compensation circuits (each being equivalent to the compensation circuit shown in FIG. 15), wherein the compensated voltage of the one compensation circuit (corresponding to the transconductance G2A) is fed to the voltage input of the transconductance G2B, and the compensated voltage of the other compensation circuit (corresponding to the transconductance G2A') is fed to the voltage input of the transconductance G2B'.

According to the embodiment of FIG. 15, the multiplier 1C comprises at least one fourth transconductance stage 50 (with transconductance G3) which is configured to input the second input voltage and to output a scaled voltage of the second input voltage, when being supplied with a third fixed bias current, and at least one multiplication-addition network 60 which is configured to generate a compensated voltage of the second input voltage by multiplying the pre-distorted voltage of the second input voltage from a second transconductance stage by a first factor, multiplying the scaled voltage of the second input voltage from a fourth transconductance stage by a second factor and adding the multiplied pre-distorted voltage and the multiplied scaled voltage, wherein each third transconductance stage 30 is configured to input the compensated voltage of the second input voltage from a multiplication-addition network 60.

Figure 16:
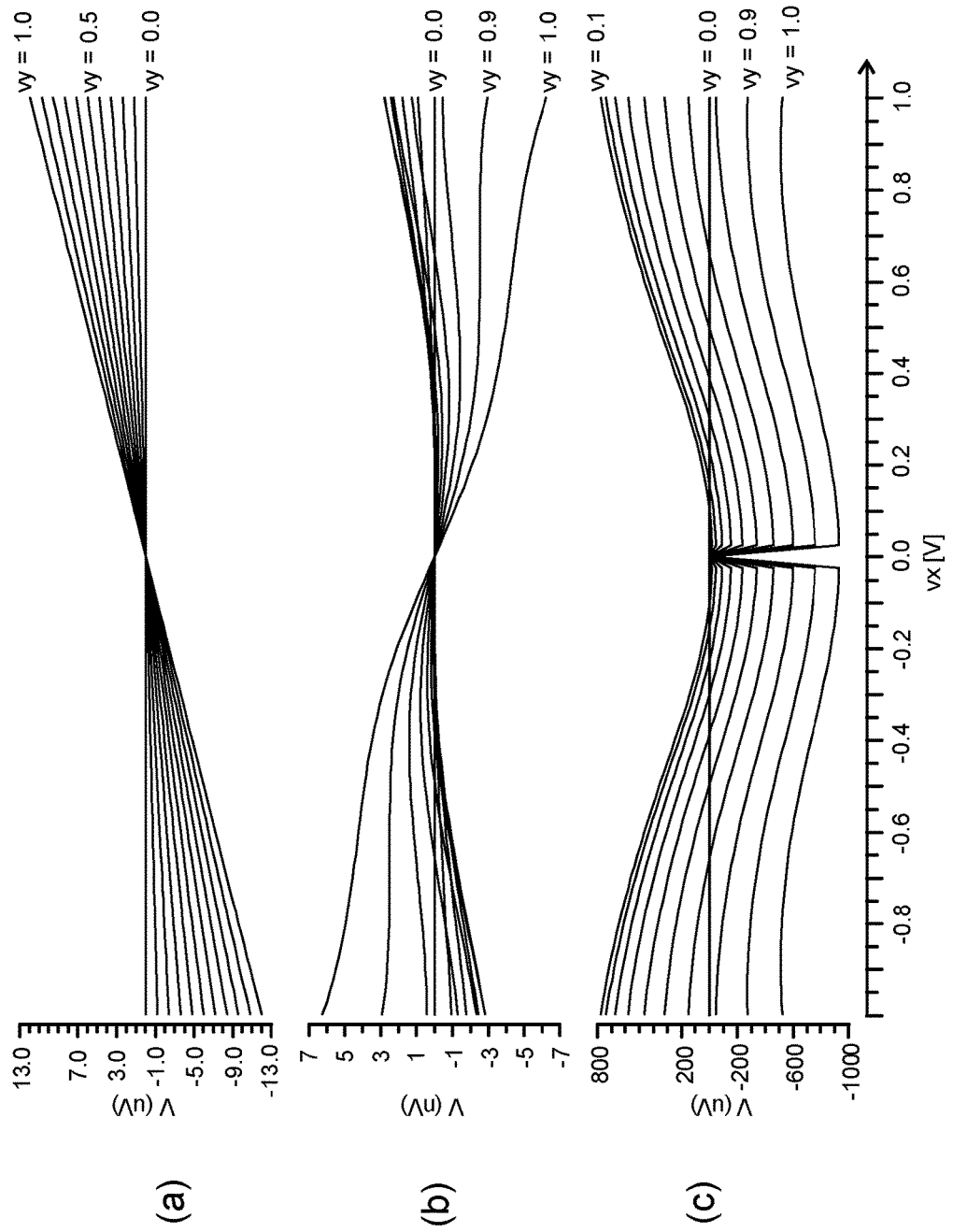
FIG. 16 shows examples of error characteristics with respect to a first input voltage of the multiplier in line with the circuit diagram of FIG. 15 according to an embodiment.
Figure 17:
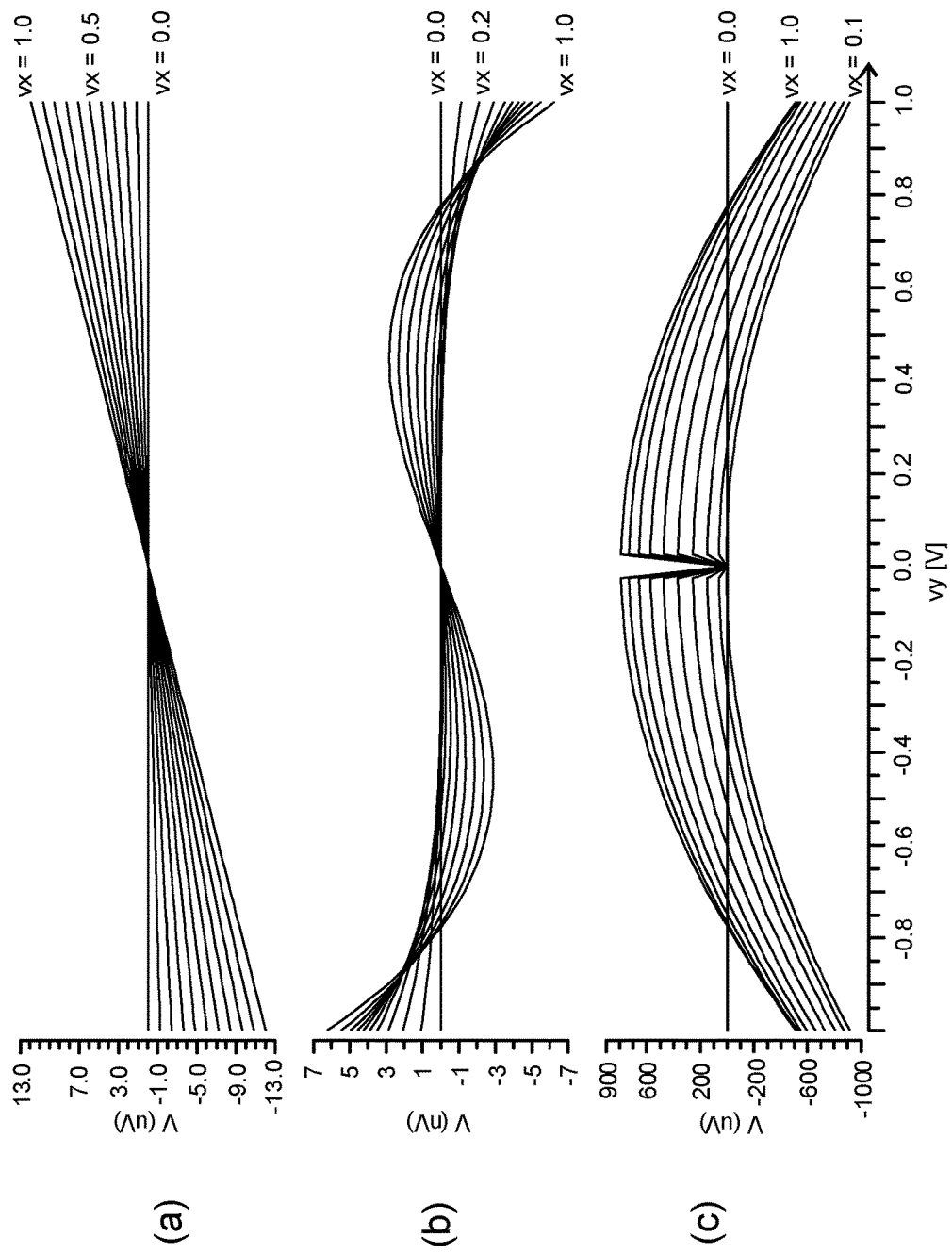
FIG. 17 shows examples of error characteristics with respect to a second input voltage of the multiplier in line with the circuit diagram of FIG. 15 according to an embodiment.

FIG. 16 shows examples of error characteristics with respect to a first input voltage of the multiplier in line with the circuit diagram of FIG. 15 according to an embodiment, and FIG. 17 shows examples of error characteristics with respect to a second input voltage of the multiplier in line with the circuit diagram of FIG. 15 according to an embodiment. That is, FIGS. 16 and 17 represent results of simulations based on the circuit diagram of FIG. 15 (with an implementation of the individual parts/units in line with the transistor circuits as illustrated in FIG. 10).

As the graphs of FIGS. 16 and 17 are equivalent to the graphs of FIGS. 13 and 14, reference is made to their description for details, while a repeated description is omitted here. As indicated above, the graphs of FIGS. 16 and 17 result from a simulation on the basis of the circuit diagram of FIG. 15 when a factor ky of 0.45 is applied.

By way of a comparison of FIGS. 16 and 17 with FIGS. 13 and 14, it can be recognized that an error compensation by a factor of 10 can be achieved. Namely, if the multiplier is linearized at $v_{x0}=0.1$ V and $v_{y0}=0.1$ V, all relative errors are less than 0.1%.

Figure 18:
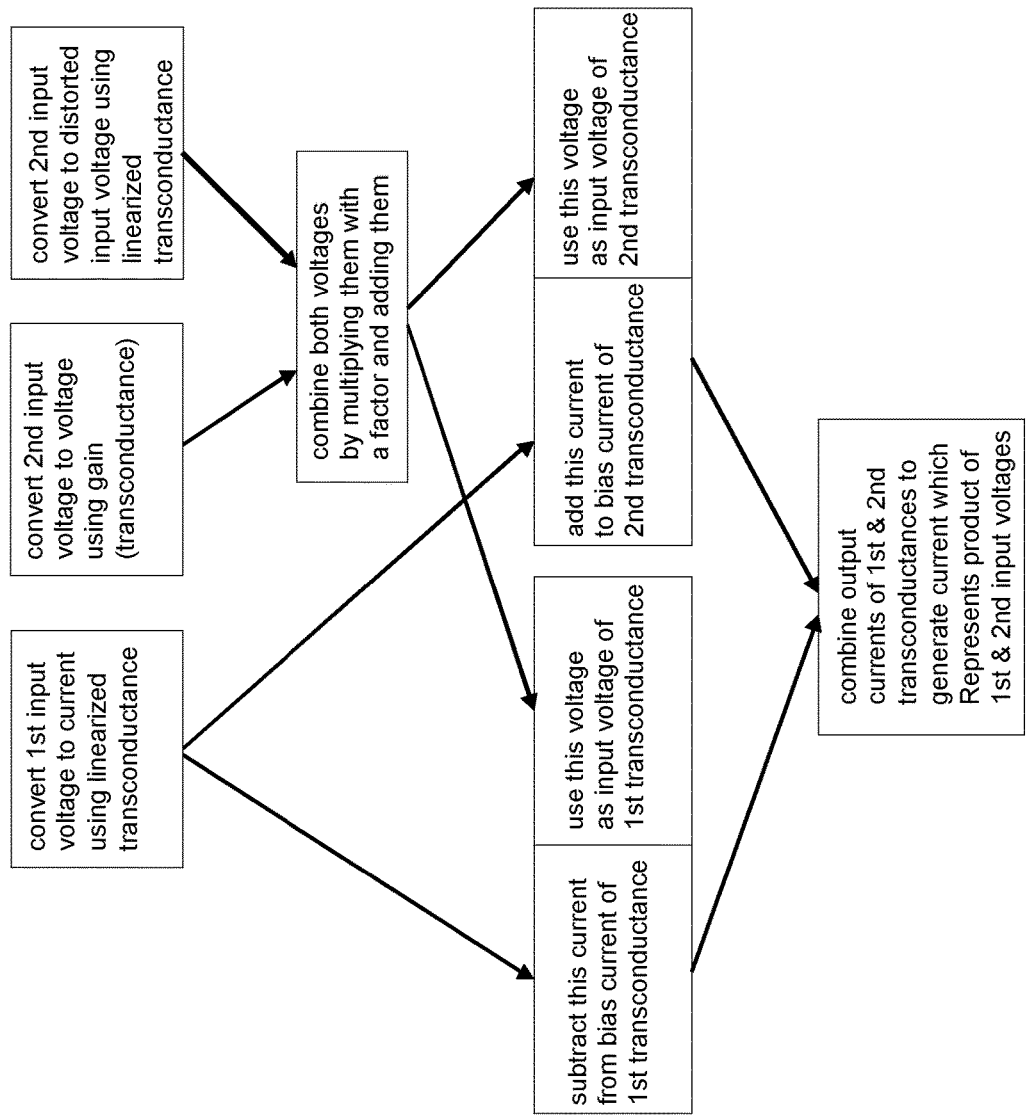
FIG. 18 shows an example of an operating process or signal flow of the multiplier in line with the circuit diagram of FIG. 15 according to an embodiment.

FIG. 18 shows an example of an operating process or signal flow of the multiplier in line with the circuit diagram of FIG. 15 according to an embodiment. Namely, FIG. 18 shows an operating process or signal flow of a linearized and error-compensated multiplier according to an embodiment.

The schematic diagram shown in FIG. 18 illustrates the operation of the multiplier in line with the circuit diagram of FIG. 15, i.e. the operating process (i.e. method of operating the multiplier) or the signal flow thereof. As the thus shown operation is merely an illustration of what is described before in terms of the operability of the multiplier and its parts, the contents of FIG. 15 is held to be self-explanatory for the skilled person such that a detailed description thereof is omitted while making reference to the above description in connection with FIG. 15 (as well as FIGS. 4 to 7).

By way of example, referring to FIG. 15, the stage 10 converts the first input voltage to a current using the linearized transconductance, the stage 20 converts the second input voltage to a (pre-)distorted voltage using the linearized transconductance, and the stage 50 converts the second input voltage to a voltage using a gain (transconductance). The stage 60 combines the outputs from the stages 20 and 50 to generated a compensated voltage. The current from the stage 10 is subtracted from a bias current of a first transconductance of the upper stage 30, and the upper stage 30 uses the compensated voltage from the stage 60 as input voltage. The current from the stage 10 is added to a bias current of a second transconductance of the lower stage 30, and the lower stage 30 uses the compensated voltage from the stage 60 as input voltage. Then, the combination network 40 combines the outputs from the first and second transconductances, i.e. the upper and lower stages 30.

As explained above, a multiplier with even further improved linearity, especially a Gilbert-type multiplier in CMOS technology, can be realized with the circuit structures of FIG. 15.

In the foregoing, various examples and embodiments for realizing a highly linear multiplier, i.e. a multiplier capable of realizing a multiplication with high accuracy, especially a Gilbert-type multiplier in CMOS technology, are disclosed.

The thus disclosed examples and embodiments are for illustrative purposes, without limiting the present disclosure. For example, analog multipliers are exemplified, i.e. configurations in which analog input signals (e.g. voltages) are multiplied to produce an analog output signal (e.g. current). The present disclosure is, however, not limited to such (completely) analog configuration, and equally encompasses fully or partly digital configurations, such as e.g. a combined analog-digital (design of a) multiplier. In such analog-digital (design of a) multiplier, an analog signal could be subjected to pulse width modulation (PWM) and the PWM signal could be used as an input signal, and/or the reference signal of a digital-to-analog converter (DAC) could be used as the one analog input signal and the digital input of the DAC could be used as the other analog input signal, for example.

While in the foregoing reference is made to a multiplier, the thus disclosed circuit structures and configurations are generally applicable in/to any kind of electric circuit, unit or device. For example, the exemplified multipliers are applicable in/to a digital-to-analog converter (DAC) or any other element which could, at least under certain conditions and/or assumptions, be considered as (part of) a multiplier. Further, the exemplified multipliers are applicable in/to any kind of analog computing circuit or device as well as computers for (implementing/realizing) artificial intelligence, computers for (performing) neural signal processing, circuits or devices for (implementing/realizing) any kind of neural network, or the like. Accordingly, the present disclosure enables to build analog computing circuits or devices or analog computers based on CMOS technology, which are suitable and competitive in the field of artificial intelligence as well as neural signal processing and neural networking.

Moreover, it is noted that all of the exemplified parts, stages, units, etc. can be implemented and used alone or in any conceivable combination, with the illustrated circuit structures and configurations merely representing non-limiting examples. For example, the units of FIGS. 5 and 6 can be applied/used as such or in any kind of electric circuit, unit or device (even other than a multiplier), respectively.

As a further supplement/addition, the following explanations are applicable for and thus constitute part of the present disclosure.

A highly linear multiplier is provided, which exhibits at least part of the following features or attributes.

- Series-connected transconductance stages (differential stages) can be used.
- The transconductance stages (differential stages) at the input of input voltages are linearized by negative feedback.
- The transconductance stages (differential stages) can be realized with MOS or CMOS transistors as transconductances.
- A first signal input is converted by means of a linearized transconductance stage or transconductance into a current which is fed as working current into the transconductance stage (differential stage) of a second transconductance.
- The second transconductance is connected to a second signal input, and is linearized by using a third transconductance with negative feedback to convert the second signal input into a differential signal for the second transconductance which itself does not require negative feedback.
- The second transconductance can be implemented twice, one of the doubly implemented transconductances being fed with the positively oriented current from the first transconductance, the other of the doubly implemented transconductance being fed with the negatively oriented current from the first transconductance, and the currents from the two doubled transconductances are combined with the correct sign in order to generate an output signal which corresponds to that of a four-quadrant multiplier.

A highly linear multiplier is based on the following considerations.

The non-linearity of a differential MOS or CMOS stage is essentially caused by the non-linear current-voltage conversion, and less by a non-proportional sharing of the common current in the differential stage when the input voltage is constant.

The transconductance stages (differential stages), which are fed with the current from the first transconductance, are driven with a voltage which is pre-distorted with respect to the original second input voltage, so that the change of the differential current becomes proportional to the original second input voltage.

The pre-distortion is performed by adding an equivalent or even (substantially) identical transconductance to the transconductance to be linearized, which has a negative feedback, so that the signal for driving the transconductance to be linearized is generated at the transistor input of this negative feedback transconductance.

A cascading of the transconductances can be realized, which is effective to achieve the function of a four-quadrant multiplier. In this regard, the first transconductance has at least two identical current outputs, where one current output is used for the negative feedback, and the other current output is used to provide the operating current for the subsequent or cascaded transconductance/s.

The error of the multiplier can be further reduced by applying the second signal input not only to a linearized transconductance (with a negative feedback) for pre-distortion, but also using the second signal input without pre-distortion, just scaled with a gain, which can e.g. be less than one.

Then, the scaled second input signal and a scaled portion of the pre-distorted second input signal are added, and the two transconductances, which process the pre-distorted second input signal as voltage and the first input signal as current, are fed to the voltage input.

The present disclosure also covers any conceivable combination of structural or functional elements described above, as long as the above-described concepts of methodology and structural arrangement are applicable.

In view of the above, there is provided a linearized multiplier configured to produce an output current representing a product of a first input voltage and a second input voltage, comprising: a first transconductance stage which is configured to input the first input voltage and to output a first pair of differential currents, wherein the first transconductance stage comprises a negative feedback network, at least one second transconductance stage which is configured to input the second input voltage and to output a pre-distorted voltage of the second input voltage, wherein each second transconductance stage comprises a negative feedback network, a pair of third transconductance stages, each of which is configured to input a voltage corresponding to the pre-distorted voltage of the second input voltage and to output a second pair of differential currents, when being supplied with a bias current corresponding to a respective current of the first pair of differential currents.

Even though the present disclosure is described above with reference to the examples according to the accompanying drawings, it is to be understood that the present disclosure is not restricted thereto. Rather, it is apparent to those skilled in the art that the present disclosure can be modified in many ways without departing from the scope of the inventive idea as disclosed herein.

The invention claimed is:

1. A multiplier (1A, 1B, 1C) configured to produce an output current representing a product of a first input voltage and a second input voltage, comprising:
a first transconductance stage which is configured to input the first input voltage and to output a first pair of differential currents, when being supplied with a first fixed bias current, wherein the first transconductance stage comprises a negative feedback network,
at least one second transconductance stage which is configured to input the second input voltage and to output a pre-distorted voltage of the second input voltage, when being supplied with a second fixed bias current, wherein each second transconductance stage comprises a negative feedback network,
a pair of third transconductance stages, each of which is configured to input a voltage corresponding to the pre-distorted voltage of the second input voltage and to output a second pair of differential currents, when being supplied with a bias current corresponding to a respective current of the first pair of differential currents, and
a combination network which is configured to generate the output current by combining the second pairs of differential currents from both of the pair of third transconductance stages.

2. The multiplier according to claim 1, wherein
the first transconductance stage comprises two current outputs for each of the first pair of differential currents, and
the first transconductance stage is configured such that, for each of the first pair of differential currents, one of the two current outputs is subtracted from a first reference current corresponding to an output current at an operating point of the first transconductance stage and the resulting current difference is fed back via a feedback resistor to an input side of the first transconductance stage, and the other one of the two current outputs is output from the first transconductance stage.

3. The multiplier according to claim 2, wherein
each second transconductance stage is configured such that, for each of a pair of currents at an output side of the second transconductance stage, the current is subtracted from a second reference current corresponding to an output current at an operating point of the second transconductance stage and the resulting current difference is fed back via a feedback resistor on a feedback path to an input side of the second transconductance stage, and
each second transconductance stage is configured to output, as the pre-distorted voltage, a potential difference between the two feedback paths.

4. The multiplier according to claim 1, wherein
the second fixed bias current of a second transconductance stage is set to be in the middle of a range of the bias current of a third transconductance stage which is configured to input the voltage based on the pre-distorted voltage from said second transconductance stage.

5. The multiplier according to claim 1, wherein
a transconductance of a second transconductance stage is at least substantially equal to a transconductance of a third transconductance stage which is configured to input the voltage based on the pre-distorted voltage from said second transconductance stage.

6. The multiplier according to claim 1, wherein a second transconductance stage and a third transconductance stage which is configured to input the voltage based on the pre-distorted voltage from said second transconductance stage are matched to each other.

7. The multiplier according to claim 1, wherein a gain of a second transconductance stage is set to be such that input of the pre-distorted voltage of the second input voltage causes a third transconductance stage, which is configured to input the voltage based on the pre-distorted voltage from said second transconductance stage, to output the second pair of differential currents being equal to a pair of differential currents which is generated by the transconductance of said second transconductance stage upon input of the second input voltage.

8. The multiplier according to claim 1, wherein each third transconductance stage is configured to input the pre-distorted voltage of the second input voltage from a second transconductance stage.

9. The multiplier according to claim 1, wherein: the pre-distorted voltage of the second input voltage is used to generate a compensated voltage, wherein the compensated voltage compensates for errors in the output current with respect to an exact algebraic product of the first input voltage and the second input voltage.

10. The multiplier according to claim 1, further comprising:
at least one fourth transconductance stage which is configured to input the second input voltage and to output a scaled voltage of the second input voltage, when being supplied with a third fixed bias current, and
at least one multiplication-addition network which is configured to generate a compensated voltage of the second input voltage by multiplying the pre-distorted voltage of the second input voltage from a second transconductance stage by a first factor, multiplying the scaled voltage of the second input voltage from a fourth transconductance stage by a second factor and adding the multiplied pre-distorted voltage and the multiplied scaled voltage,
wherein each third transconductance stage is configured to input the compensated voltage of the second input voltage from a multiplication-addition network.

11. The multiplier according to claim 1, wherein each transconductance stage comprises a differential pair of CMOS transistors with the bias current as tail current.

12. The multiplier according to claim 1, wherein the multiplier is integrated in CMOS technology.

13. The multiplier according to claim 11, wherein the first transconductance stage is built with NMOS transistors, and any one of the second and third transconductance stages are built with PMOS transistors.

14. The multiplier according to claim 1, wherein the first and second input voltages are or represent analog signals, or
at least one of the first and second input voltages is or represents a signal resulting from pulse width modulation of an analog signal, or
one of the first and second input voltages is or represents a signal a reference signal of a digital-to-analog converter, and the other one of the first and second input voltages is or represents a digital input of the digital-to-analog converter.

15. A multiplier (1A, 1B, 1C) configured to produce an output current representing a product of a first input voltage and a second input voltage, comprising:
a first transconductance stage which is configured to input the first input voltage and to output a first pair of differential currents, when being supplied with a first fixed bias current, wherein the first transconductance stage comprises a negative feedback network,
at least one second transconductance stage which is configured to input the second input voltage and to output a pre-distorted voltage of the second input voltage, when being supplied with a second fixed bias current, wherein each second transconductance stage comprises a negative feedback network,
a pair of third transconductance stages, each of which is configured to input a voltage corresponding to the pre-distorted voltage of the second input voltage and to output a second pair of differential currents, when being supplied with a bias current corresponding to a respective current of the first pair of differential currents, and
a combination network which is configured to generate the output current by combining the second pairs of differential currents from both of the pair of third transconductance stages, wherein
the first transconductance stage comprises two current outputs for each of the first pair of differential currents,
the first transconductance stage is configured such that, for each of the first pair of differential currents, one of the two current outputs is subtracted from a first reference current corresponding to an output current at an operating point of the first transconductance stage and the resulting current difference is fed back via a feedback resistor to an input side of the first transconductance stage, and the other one of the two current outputs is output from the first transconductance stage,
each second transconductance stage is configured such that, for each of a pair of currents at an output side of the second transconductance stage, the current is subtracted from a second reference current corresponding to an output current at an operating point of the second transconductance stage and the resulting current difference is fed back via a feedback resistor on a feedback path to an input side of the second transconductance stage, and
each second transconductance stage is configured to output, as the pre-distorted voltage, a potential difference between the two feedback paths.

16. The multiplier according to claim 15, wherein the second fixed bias current of a second transconductance stage is set to be in the middle of a range of the bias current of a third transconductance stage which is configured to input the voltage based on the pre-distorted voltage from said second transconductance stage,
a transconductance of a second transconductance stage is at least substantially equal to a transconductance of a third transconductance stage which is configured to input the voltage based on the pre-distorted voltage from said second transconductance stage, and
a second transconductance stage and a third transconductance stage which is configured to input the voltage based on the pre-distorted voltage from said second transconductance stage are matched to each other.

17. The multiplier according to claim 15, wherein
a gain of a second transconductance stage is set to be such that input of the pre-distorted voltage of the second input voltage causes a third transconductance stage, which is configured to input the voltage based on the pre-distorted voltage from said second transconductance stage, to output the second pair of differential currents being equal to a pair of differential currents which is generated by the transconductance of said second transconductance stage upon input of the second input voltage.

18. The multiplier according to claim 15, further comprising:
at least one fourth transconductance stage which is configured to input the second input voltage and to output a scaled voltage of the second input voltage, when being supplied with a third fixed bias current, and
at least one multiplication-addition network which is configured to generate a compensated voltage of the second input voltage by multiplying the pre-distorted voltage of the second input voltage from a second transconductance stage by a first factor, multiplying the scaled voltage of the second input voltage from a fourth transconductance stage by a second factor and adding the multiplied pre-distorted voltage and the multiplied scaled voltage,
wherein each third transconductance stage is configured to input the compensated voltage of the second input voltage from a multiplication-addition network.

19. A multiplier (1A, 1B, 1C) configured to produce an output current representing a product of a first input voltage and a second input voltage, comprising:
a first transconductance stage which is configured to input the first input voltage and to output a first pair of differential currents, when being supplied with a first fixed bias current, wherein the first transconductance stage comprises a negative feedback network,
at least one second transconductance stage which is configured to input the second input voltage and to output a pre-distorted voltage of the second input voltage, when being supplied with a second fixed bias current, wherein each second transconductance stage comprises a negative feedback network,
a pair of third transconductance stages, each of which is configured to input a voltage corresponding to the pre-distorted voltage of the second input voltage and to output a second pair of differential currents, when being supplied with a bias current corresponding to a respective current of the first pair of differential currents, and
a combination network which is configured to generate the output current by combining the second pairs of differential currents from both of the pair of third transconductance stages,
wherein each transconductance stage is realized with MOSFET transistors in CMOS technology.

20. The multiplier according to claim 19, wherein
the first transconductance stage comprises two current outputs for each of the first pair of differential currents,
the first transconductance stage is configured such that, for each of the first pair of differential currents, one of the two current outputs is subtracted from a first reference current corresponding to an output current at an operating point of the first transconductance stage and the resulting current difference is fed back via a feedback resistor to an input side of the first transconductance stage, and the other one of the two current outputs is output from the first transconductance stage,
each second transconductance stage is configured such that, for each of a pair of currents at an output side of the second transconductance stage, the current is subtracted from a second reference current corresponding to an output current at an operating point of the second transconductance stage and the resulting current difference is fed back via a feedback resistor on a feedback path to an input side of the second transconductance stage, and
each second transconductance stage is configured to output, as the pre-distorted voltage, a potential difference between the two feedback paths.

* * * * *